US006948232B1

(12) United States Patent
Yazawa et al.

(10) Patent No.: US 6,948,232 B1
(45) Date of Patent: Sep. 27, 2005

(54) COMPONENT RECOGNIZING METHOD AND APPARATUS, AND COMPONENT MOUNTING METHOD AND APPARATUS

(75) Inventors: Takashi Yazawa, Yamanashi (JP); Hiroshi Uchiyama, Kofu (JP); Atsushi Tanabe, Yamanashi (JP); Yoichi Tanaka, Yamanashi (JP); Takahiro Kurokawa, Kofu (JP); Naoto Mimura, Yamanashi (JP); Nobuyuki Kakita, Kofu (JP); Osamu Okuda, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 141 days.

(21) Appl. No.: 10/069,988

(22) PCT Filed: Aug. 31, 2000

(86) PCT No.: PCT/JP00/05909

§ 371 (c)(1),
(2), (4) Date: Mar. 1, 2002

(87) PCT Pub. No.: WO01/19156

PCT Pub. Date: Mar. 15, 2001

(30) Foreign Application Priority Data

Sep. 2, 1999 (JP) .................................. 11/248380
Nov. 5, 1999 (JP) .................................. 11/315064

(51) Int. Cl.⁷ .............................................. B23P 19/00
(52) U.S. Cl. ............................. 29/740; 29/739; 29/833
(58) Field of Search .......................... 29/740, 840, 752, 29/834, 832, 759, 833, 739, 852

(56) References Cited

U.S. PATENT DOCUMENTS

| 4,881,319 | A | * | 11/1989 | Yagi et al. ..................... 29/840 |
| 5,377,405 | A | * | 1/1995 | Sakurai et al. ................ 29/833 |
| 5,383,270 | A | * | 1/1995 | Iwatsuka et al. .............. 29/840 |
| 5,491,888 | A | * | 2/1996 | Sakurai et al. ................ 29/832 |
| 5,566,447 | A | * | 10/1996 | Sakurai ........................ 29/832 |
| 5,860,208 | A | * | 1/1999 | Nomura ........................ 29/740 |
| 5,864,944 | A | * | 2/1999 | Kashiwagi et al. ........... 29/833 |
| 6,044,169 | A | * | 3/2000 | Hirotani et al. .............. 382/145 |
| 6,446,333 | B1 | * | 9/2002 | Kashiwagi et al. ........... 29/833 |
| 6,606,790 | B2 | * | 8/2003 | Hidese ......................... 29/832 |

FOREIGN PATENT DOCUMENTS

| EP | 0 779 777 | 6/1997 |
| EP | 0 838 992 | 4/1998 |
| EP | 0 854 671 | 7/1998 |

(Continued)

OTHER PUBLICATIONS

"Rotating Probe Assembly With Z Motion" IBM Technical Disclosure Bulletin, IBM Corp., New York, vol. 33, No. 2, Jul. 1, 1990, pp. 313-314, XP000123633.

*Primary Examiner*—Carl J. Arbes
(74) *Attorney, Agent, or Firm*—Wenderoth, Lind & Ponack, L.L.P.

(57) ABSTRACT

Disclosed are a component recognizing method and apparatus, and a component mounting method and apparatus, by which components with various heights held by a plurality of nozzles can be recognized continuously. The drive of a head is transmitted to nozzles, with surfaces to be recognized of components being controlled so as to be positioned in a recognizable range during respective recognizing operations of the components, and a continuous recognition is thereby made possible. The adjustment of heights of the surfaces to be recognized during the recognizing operations of the components is achieved by one drive unit and a plurality of drive transmitting units.

15 Claims, 25 Drawing Sheets

FOREIGN PATENT DOCUMENTS

| | | |
|---|---|---|
| JP | 8-8600 | 1/1996 |
| JP | 8-32299 | 2/1996 |
| JP | 9-246794 | 9/1997 |
| KR | 00177235 | 11/1998 |

* cited by examiner

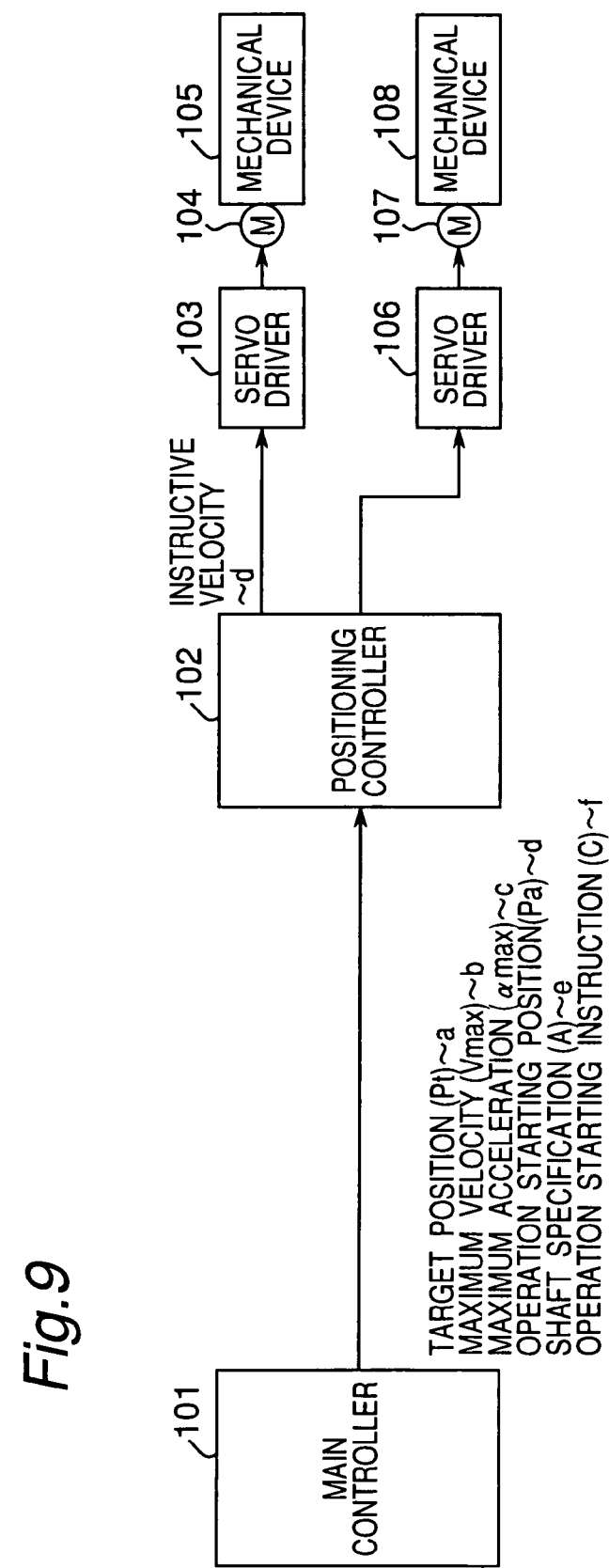

CAPTURED IMAGE

COMPONENT RECOGNIZING METHOD AND APPARATUS, AND COMPONENT MOUNTING METHOD AND APPARATUS

This application is a National Stage of International Application No. PCT/JP00/05909, filed Aug. 31, 2000.

TECHNICAL FIELD

The present invention relates particularly to a component recognizing method and apparatus for recognizing components prior to installation of the components onto objects to be installed, such as boards and components, and to a component mounting method and apparatus for installing recognized components onto the objects, such as boards and components, in component mounting equipment for mounting components such as electronic components and optical components.

BACKGROUND ART

As a head unit having suction nozzles for sucking and holding components in such a component mounting apparatus, for example, such a head unit 700 as shown in FIG. 3 has been known conventionally. In such a component mounting apparatus 1500 as shown in FIG. 24, for example, head unit 1700 is installed in an X-Y robot 1500X for moving the head unit 1700 in X-Y directions, suction nozzles of the head unit 1700 driven by the X-Y robot 1500X suck and hold components fed from component feeding units 1500H and 1500I for production of a mounted board 1500J and, after recognition of shapes of the components and correction of the postures thereof, the head unit mounts the components onto the board 1500J. Reference character 1500M in FIG. 24 denotes a motor that drives the head unit 1700 in the direction of Y axis of the X-Y robot 1500X and, during movement in the direction of Y axis, components sucked and held by the suction nozzles are moved over a recognition camera and recognized.

Such a head unit 770 as shown in FIG. 5 also has been known, and the head unit 770 has a configuration and a function which are similar to those of the head unit 700 of FIG. 3.

Hereinbelow, configurations of the head units 700 and 770 will be described.

In FIG. 3, reference numeral 701 denotes a frame that serves as a foundation of the head unit 700, and the frame moves about a component mounting apparatus in combination with a robot unit that drives the head unit 700 in X-Y directions of the component mounting apparatus. Reference numeral 702 denotes a motor that is a drive source and is integral with the frame, and thus a table 703 is moved in directions E and F, i.e., in vertical directions. Reference numerals 724 to 733 denote nozzles which suck and hold components, and the nozzles 724 to 733 are normally biased by springs 714 to 723 in a direction E so as to remain still. Reference numerals 704 to 713 denote cylinders which selectively transmit drives from the table 703 to the nozzles 724 to 733 in the directions E and F. From among the cylinders 704 to 713, only the cylinders corresponding to the nozzles to which actions are to be transmitted from the table 703 are driven to come into contact with only those nozzles (from among the nozzles 724 to 733) to effect forces in the direction E so that vertical movement of the table 703 causes movements of the selected nozzles in the directions E and F through actions of the driven cylinders. On the contrary, from among the cylinders 704 to 713, the cylinders which do not transmit movements in the directions E and F are not driven and do not come into contact with the nozzles 704 to 713 and therefore do not cause movements in the directions E and F.

Hereinbelow, movement of the head unit 700 configured as above will be described. In FIGS. 4A to 4C, only four nozzles 724, 725, 726, and 727 out of the ten nozzles are shown for brevity.

At commencement of recognition in FIG. 4A, for example, four nozzles 724, 725, 726, and 727 out of the ten nozzles simultaneously descend to a specified height while holding components 695, 696, 697, and 698, and the component 695, then the component 696, then the component 697 and then the component 698 are subsequently recognized in order of mention in accordance with a direction R of a movement of the head unit 700, via a recognition camera 600, i.e., a component shape recognition unit. At this time, focus of the recognition camera 600 is obtained in a diagonally shaded range P in FIG. 4A, and recognition can be achieved only in the range P. Bottom surfaces of the components 695, 696, and 697 can be positioned in the range P through vertical movements of the nozzles 724, 725, and 726, and can be recognized via the recognition camera 600. On the other hand, a bottom surface of the component 698 is out of the range P and cannot be recognized via the recognition camera 600. Accordingly, shapes of components having different heights such as the components 695, 696, and 697 and the component 698 cannot be recognized continuously, for example, in the order of the component 695, then the component 696, then the component 697 and then the component 698.

In practice, as shown in FIG. 4B, the shapes of the components 695, 696, and 697 which are held by the nozzles 724, 725, and 726 and can be simultaneously recognized are continuously recognized. After that, the component 698 is held by the nozzle 727 and then a height of the nozzle 727 relative to the recognition camera 600 is switched and the component 698 is recognized.

The configuration of the head unit 770 shown in FIG. 5 will be described below.

Reference numeral 771 denotes a frame that serves as a foundation of the head unit 770, and the frame 771 is integral with motors 772, 773, and 774 which are drive sources. Numerals 775, 776, and 777 denote ball screws which are rotated individually by the motors 772, 773, and 774, respectively, and numerals 778, 779, and 780 denote nozzles for holding components. Rotational drive caused by the motors 772, 773, and 774 is transmitted to the nozzles 778, 779, and 780 through a medium of the ball screws 775, 776, and 777 so as to move the nozzles vertically. As a result, settings of vertical movements of the nozzles 778, 779, and 780 can be individually provided by the motors 772, 773, and 774.

Hereinbelow, movement of the head unit 770 configured as above will be described.

In FIG. 6, drives of the nozzles 778, 779, and 780 in directions U and V, i.e., in upward and downward directions in FIG. 5 are individually controlled by the motors 772, 773, and 774. Thus, components 787, 788, and 789 are held respectively and then positions of the components are individually adjusted so that bottom surfaces of the components come into a recognizable range P in which focus of a component shape recognition unit 600 is obtained. In this manner, shape recognition and mounting of the components 787, 788, and 789 having different heights are performed continuously in the order of the component 787, then the component 788, and then the component 789.

On the other hand, such a configuration of the head unit 700 as mentioned above with reference to FIG. 3 causes an increase in the number of times of component shape recognition with an increase in a variety of heights of components to be mounted and, at the same time, causes an increase in a transit time of the head unit 700 for feeding of the components, so that an increase in tact time for mounting the components onto boards influences productivity of mounted boards.

In recent years, however, a need for mounting of various types of components has increased and component mounting apparatus which are capable of recognizing various components continuously have been essential for board mounting with high efficiency.

With such a configuration of the head unit 770 as mentioned above with reference to FIG. 5, shapes of components can be continuously recognized regardless of a difference in heights of the components; however, a necessity for a plurality of drive sources not only raises a cost of the head unit itself but may exert an influence on dynamic characteristics of a robot for driving the head unit because of an increase in weight of the head unit and other influences. This results in a limitation of the number of nozzles, which may inhibit improvement of efficiency of component mounting.

It is an object of the present invention to solve the above-mentioned issues; that is, to provide a component recognizing method and apparatus, and component mounting method and apparatus by which components with various heights held by a plurality of component holding members can be recognized continuously.

SUMMARY OF INVENTION

In order to achieve the above-mentioned object, the present invention is configured as will be described below.

According to a first aspect of the present invention, there is provided a component recognizing method for recognizing, via one recognition unit, surfaces to be recognized of a plurality of components held by a plurality of component holding members which are vertically moved selectively by a single drive unit, with the surfaces to be recognized being at different heights, in which heights of the component holding members are controlled so as to bring a surface to be recognized of each of the plurality of components into a recognizable range of the recognition unit, and the surfaces to be recognized of the plurality of components are continuously recognized.

According to a second aspect of the present invention, there is provided a component recognizing method as defined in the first aspect, wherein the plurality of components held by the plurality of component holding members, and having the surfaces to be recognized at different heights, have such a variation in height that not all the surfaces to be recognized of the plurality of components are within the recognizable range of the recognition unit when bottom end surfaces of the plurality of component holding members are situated at an identical height.

According to a third aspect of the present invention, there is provided a component recognizing method as defined in the second aspect, wherein, from among the plurality of components held by the plurality of component holding members and having the surfaces to be recognized at different heights, which components have such a variation in height that not all the surface to be recognized of the plurality of components are within the recognizable range of the recognition unit when the bottom end surfaces of the plurality of component holding members are situated at an identical height, components of which the surfaces to be recognized are within the recognizable range of the recognition unit are recognized without a selective vertical movement of component holding members holding these components by drive of a single drive unit and without a change in heights of the surfaces, and components of which the surfaces to be recognized are out of the recognizable range of the recognition unit are recognized after performing a positioning operation via vertical movement of component holding members holding these components, so as to bring the surfaces to be recognized of these components into the recognizable range of the recognition unit.

According to a fourth aspect of the present invention, there is provided a component recognizing method as defined in any one of the first to third aspects, wherein shapes of the components are recognized when the surfaces to be recognized of the components are recognized.

According to a fifth aspect of the present invention, there is provided a component recognizing apparatus for recognizing, via one recognition unit, surfaces to be recognized of a plurality of components held by a plurality of component holding members which are vertically moved selectively by a single drive unit and having the surfaces to be recognized at different heights, wherein heights of the component holding members are adapted to be controlled so as to bring a surface to be recognized of each of the plurality of components into a recognizable range of the recognition unit and continuously recognizable the surfaces to be recognized of the plurality of components.

According to a sixth aspect of the present invention, there is provided a component recognizing apparatus as defined in the fifth aspect, wherein the plurality of components held by the plurality of component holding members and having the surfaces to be recognized at different heights, have such a variation in height that not all the surface to be recognized of the plurality of components are within the recognizable range of the recognition unit when bottom end surfaces of the plurality of component holding members are situated at an identical height.

According to a seventh aspect of the present invention, there is provided a component recognizing apparatus as defined in the sixth aspect, wherein, from among the plurality of components held by the plurality of component holding members and having the surfaces to be recognized at different heights, which components have such a variation in height that not all the surfaces to be recognized of the plurality of components are within the recognizable range of the recognition unit when the bottom end surfaces of the plurality of component holding members are situated at an identical height, components of which the surfaces to be recognized are within the recognizable range of the recognition unit are recognized without a selective vertical movement of component holding members holding these components by drive of the single drive unit and without a change in heights at which the surfaces are located, and components of which the surfaces to be recognized are out of the recognizable range of the recognition unit are recognized after performing a positioning operation via vertical movement of component holding members holding these components, so as to bring the surfaces to be recognized of these components into the recognizable range of the recognition unit.

According to an eighth aspect of the present invention, there is provided a component recognizing apparatus as defined in any one of the fifth to seventh aspects, wherein shapes of the components are adapted to be recognized when the surfaces to be recognized of the components are recognized.

According to a ninth aspect of the present invention, there is provided a component mounting apparatus comprising:
 a single drive unit;
 a plurality of component holding members which are adapted to be vertically moved selectively by the single drive unit and hold a plurality of components;
 a head unit including the single drive unit and the plurality of component holding members; and
 one recognition unit which is adapted to recognize surfaces to be recognized of the plurality of components held by the plurality of component holding members when the surfaces to be recognized are within a recognizable range,
 wherein heights at which the component holding members are located are adapted to be controlled so as to bring a surface to be recognized of each of the plurality of components into the recognizable range of the recognition unit, and the recognition unit continuously recognizes the surfaces to be recognized of the plurality of components when the surfaces to be recognized of the plurality of components held by the plurality of component holding members and having the surfaces to be recognized at different heights are brought into the recognizable range of the one recognition unit while the head unit is moving.

According to a tenth aspect of the present invention, there is provided a component mounting apparatus as defined in the ninth aspect, wherein the plurality of components held by the plurality of component holding members and having the surfaces to be recognized at different heights, have such a variation in height that not all the surfaces to be recognized of the plurality of components are within the recognizable range of the recognition unit when bottom end surfaces of the plurality of component holding members are situated at an identical height.

According to an eleventh aspect of the present invention, there is provided a component mounting apparatus as defined in the ninth aspect, wherein, from among the plurality of components held by the plurality of component holding members and having the surfaces to be recognized of different heights, which components have such a variation in height that not all the surfaces to be recognized of the plurality of components are within the recognizable range of the recognition unit when the bottom end surfaces of the plurality of component holding members are situated at an identical height, components of which the surfaces to be recognized are within the recognizable range of the recognition unit are recognized without a vertical movement of component holding members holding these components and without a change in heights at which the surfaces are located, and components of which the surfaces to be recognized are out of the recognizable range of the recognition unit are recognized via the recognition unit after performing a positioning operation via a selective vertical movement of component holding members holding these components by drive of the single drive unit, so as to bring the surfaces to be recognized of these components into the recognizable range of the recognition unit.

According to a twelfth aspect of the present invention, there is provided a component mounting apparatus as defined in any one of the ninth to eleventh aspects, wherein shapes of the components are adapted to be recognized when the surfaces to be recognized of the components are recognized.

According to a thirteenth aspect of the present invention, there is provided a component mounting apparatus as defined in any one of the ninth to twelfth aspects, further comprising: a table which is adapted to be vertically moved by the single drive unit; and cylinders which are fixed to the table, corresponding to the component holding members, and are each adapted to bring a tip of a piston into contact with only a selected component holding member so as to be vertically moved from among the plurality of component holding members, and thereby transmit vertical movement of the table to the selected component holding member.

According to a fourteenth aspect of the present invention, there is provided a component recognizing method as defined in any one of the first to fourth aspects, further comprising:
 producing a velocity curve for vertical movement of the selected component holding member with parameters of a target position in a direction of height at time when vertical movement of the selected component holding member is controlled by virtue of the drive unit so as to position the surface to be recognized of a component within the recognizable range of the recognition unit, a maximum velocity during the vertical movement of the selected component holding member up to the target position, and a maximum acceleration during the vertical movement of the selected component holding member up to the target position, and
 automatically starting a positioning operation, into the recognizable range, of the surface to be recognized of the component held by the selected component holding member driven by the drive unit on a basis of the velocity curve in response to a positioning operation starting instruction upon arrival at a positioning operation starting position of the selected component holding member moving transversely toward the recognition unit.

According to a fifteenth aspect of the present invention, there is provided a component recognizing method as defined in the fourteenth aspect, wherein a plurality of sets of parameters of target positions and positioning operation starting positions are provided, and continuous positioning operations are thereby executed with provision of a plurality of timings.

According to a sixteenth aspect of the present invention, there is provided a component recognizing method as defined in the fifteenth aspect, further comprising, with a plurality of positioning operation ending positions corresponding to the plurality of positioning operation starting positions provided, judging whether individual positioning operations during continuous positioning operations, which were started at the plurality of positioning operation starting positions, have reached respective positioning operation ending positions or not so as to detect whether respective positioning operations have been completed normally or not.

According to a seventeenth aspect of the present invention, there is provided a component recognizing apparatus as defined in any one of the fifth to eighth aspects, comprising:
 a first control unit which is adapted to produce a velocity curve for vertical movement of the selected component holding member with parameters of a target position in a direction of height at time when the vertical movement of the selected component holding member is controlled by virtue of the drive unit so as to position a surface to be recognized of a component within the recognizable range of the recognition unit, a maximum velocity during the vertical movement of the selected component holding member up to the target position, and a maximum acceleration during the vertical movement of the selected component holding member up to the target position; and a second control unit which is adapted to drive the drive unit in response to a positioning operation starting instruction and automatically start a positioning operation of the selected component holding member driven by the drive unit on a basis of the velocity curve, upon arrival at a positioning operation starting position of the selected component holding member moving transversely toward the recognition unit.

According to an eighteenth aspect of the present invention, there is provided a component recognizing apparatus as defined in the seventeenth aspect, wherein a plurality of sets of parameters of target positions and positioning operation starting positions are provided, and thereby the second control unit is adapted to execute continuous positioning operations with provision of a plurality of timings.

According to a nineteenth aspect of the present invention, there is provided a component recognizing apparatus as defined in the eighteenth aspect, wherein with a plurality of positioning operation ending positions corresponding to the plurality of positioning operation starting positions provided, the second control unit is adapted to judge whether individual positioning operations during continuous positioning operations, which were started at the plurality of positioning operation starting positions, have reached respective positioning operation ending positions or not, and thereby detects whether respective positioning operations have been completed normally or not.

According to a twentieth aspect of the present invention, there is provided a component mounting apparatus as defined in the ninth aspect, wherein the single drive unit is a single motor, and the single motor is adapted to rotationally drive a ball screw and thereby vertically move a table that is in screw engagement with the ball screw, the apparatus further comprising: cylinders which are fixed to the table, corresponding to the component holding members, and each of which is adapted to bring a tip of a piston into contact with only a selected component holding member selected so as to be vertically moved from among the plurality of component holding members and thereby transmit vertical movement of the table to the selected component holding member;

a first control unit which is adapted to produce a velocity curve for vertical movement of the selected component holding member by virtue of the single motor, with parameters of a target position in a direction of height at time when vertical movement of the selected component holding member is controlled by virtue of the single motor so as to position a surface to be recognized of a component within the recognizable range of the recognition unit, a maximum velocity during the vertical movement of the selected component holding member up to the target position, and a maximum acceleration during the vertical movement of the selected component holding member up to the target position; and a second control unit which is adapted to drive the single motor in response to a positioning operation starting instruction and automatically start a positioning operations of the selected component holding members driven by the single motor on a basis of the velocity curve, upon arrival at a positioning operation starting position of the selected component holding members moving with the head unit transversely toward the recognition unit.

According to a twenty-first aspect of the present invention, there is provided a component mounting apparatus as defined in the twentieth aspect, further comprising a transverse movement motor for moving the component holding members in a transverse direction, wherein the first control unit is further adapted to produce a velocity curve during transverse movement of the selected component holding members by virtue of the transverse movement motor, with parameters of a target position in a transverse direction at a time when the transverse movement of the selected component holding members up to vertical drive starting positions for the selected component holding members is controlled by virtue of the transverse movement motor, for recognition of a surface to be recognized of a component within the recognizable range of the recognition unit, a maximum velocity during the transverse movement of the selected component holding members up to the target position, and a maximum acceleration during the transverse movement of the selected component holding members up to the target position, and the second control unit is adapted to drive the transverse movement motor in response to a positioning operation starting instruction and automatically start positioning operations of the selected component holding members driven by the transverse movement motor on the basis of the velocity curve, upon arrival at positioning operation starting positions of the selected component holding members moving with the head unit transversely toward the recognition unit.

According to a twenty-second aspect of the present invention, there is provided a component mounting method in which a plurality of components from component feeding units are held by the plurality of component holding members, the components are thereafter recognized via the component recognizing method as defined in any one of the first to fourth and fourteenth to sixteenth aspects, postures of the plurality of components held by the plurality of component holding members are thereafter corrected on a basis of a recognition result, and the components are thereafter installed onto an object to be installed.

According to a twenty-third aspect of the present invention, there is provided a component mounting apparatus which is adapted to hold a plurality of components from component feeding units by the plurality of component holding members, thereafter recognize the components with the recognition unit of the component recognizing apparatus as defined in any one of the fifth to eighth and seventeenth to nineteenth aspects, thereafter correct postures of the plurality of components held by the plurality of component holding members on a basis of a recognition result, and thereafter install the components onto an object to be installed.

According to a twenty-fourth aspect of the present invention, there is provided a component recognizing method as defined in the first aspect, wherein after the plurality of component holding members holding the plurality of components having the surfaces to be recognized at different heights are moved in one direction over the one recognition unit, the plurality of component holding members are moved in a reverse direction opposite to the one direction over the one recognition unit with heights at which are located the plurality of component holding members being changed, and each of the plurality of components held by the plurality of component holding members are imaged via the recognition unit during respective movement of the plurality of component holding members in the one direction and in the reverse direction, and the surfaces to be recognized of only components having the surfaces to be recognized brought into the recognizable range of the recognition unit, from among the plurality of components, are recognized.

According to a twenty-fifth aspect of the present invention, there is provided a component recognizing method as defined in the first aspect, wherein the plurality of component holding members holding the plurality of components having the surfaces to be recognized at different heights are moved in one direction over the one recognition unit, and the surfaces to be recognized of only components having the surfaces to be recognized brought into the recognizable range of the recognition unit, from among the plurality of components held by the plurality of component holding members, are recognized, and heights at which the plurality of component holding members are located are changed, and the plurality of component holding members are thereafter moved in a reverse direction opposite to the one direction over the one recognition unit and the surfaces to be recognized of only components having the surfaces to be recognized brought into the recognizable range of the recognition unit, from among the plurality of components held by the plurality of component holding members, are recognized.

According to a twenty-sixth aspect of the present invention, there is provided a component recognizing method as defined in the first aspect, wherein the plurality of component holding members holding the plurality of components having the surfaces to be recognized at different heights are moved over the one recognition unit, and the surfaces to be recognized of only components having the surfaces to be recognized brought into the recognizable range of the recognition unit, from among the plurality of components held by the plurality of component holding members, are recognized, and heights at which the plurality of component holding members are located are changed and the plurality of component holding members are thereafter moved over a recognition unit other than the one recognition unit, and the surfaces to be recognized of only components having the surfaces to be recognized brought into the recognizable range of the recognition unit, from among the plurality of components held by the plurality of component holding members, are recognized.

According to a twenty-seventh aspect of the present invention, there is provided a component recognizing apparatus as defined in the fifth aspect, further comprising a control unit which is adapted to move the plurality of component holding members, holding the plurality of components having the surfaces to be recognized at different heights, in one direction over the one recognition unit, thereafter move the plurality of component holding members in a reverse direction opposite to the one direction over the one recognition unit with heights at which are located the plurality of component holding members being changed, perform imaging via the recognition unit of each of the plurality of components held by the plurality of component holding members during respective movement of the plurality of component holding members in the one direction and in the reverse direction, and recognize the surfaces to be recognized of only components having the surfaces to be recognized brought into the recognizable range of the recognition unit, from among the plurality of components.

According to a twenty-eighth aspect of the present invention, there is provided a component recognizing apparatus as defined in the fifth aspect, further comprising a control unit which is adapted to move the plurality of component holding members holding the plurality of components having the surfaces to be recognized at different heights in one direction over the one recognition unit, recognize the surfaces to be recognized of only components having the surfaces to be recognized brought into the recognizable range of the recognition unit, from among the plurality of components held by the plurality of component holding members, move the plurality of component holding members in a reverse direction opposite to the one direction over the one recognition unit after changing heights at which the plurality of component holding members are located, and recognize the surfaces to be recognized of only components having the surfaces to be recognized brought into the recognizable range of the recognition unit, from among the plurality of components held by the plurality of component holding members.

According to a twenty-ninth aspect of the present invention, there is provided a component recognizing apparatus as defined in the fifth aspect, further comprising: another recognition unit capable of recognizing surfaces to be recognized of components at heights different from those of components which are recognized by virtue of the one recognition unit; and a control unit which is adapted to move the plurality of component holding members holding the plurality of components having the surfaces to be recognized at different heights over the one recognition unit, recognize the surfaces to be recognized of only components having the surfaces to be recognized brought into the recognizable range of the recognition unit, from among the plurality of components held by the plurality of component holding members, move the plurality of component holding members over the another recognition unit after changing heights at which the plurality of component holding members are located, and recognize the surfaces to be recognized of only components having the surfaces to be recognized brought into the recognizable range of the another recognition unit, from among the plurality of components held by the plurality of component holding members.

According to a thirtieth aspect of the present invention, there is provided a component recognizing method comprising:

moving a plurality of component holding members holding a plurality of components having surfaces to be recognized at different heights in one direction over a recognition unit, thereafter moving the plurality of component holding members in a reverse direction opposite to the one direction over the recognition unit with heights at which are located the plurality of component holding members being changed; and recognizing the surfaces to be recognized of components having the surfaces to be recognized brought into the recognizable range of the recognition unit, from among the plurality of components held by the plurality of component holding members, during respective movement of the plurality of component holding members in the one direction and in the reverse direction.

According to a thirty-first aspect of the present invention, there is provided a component recognizing apparatus comprising:
  a plurality of component holding members which is adapted to hold a plurality of components having surfaces to be recognized at different heights;
  a recognition unit over which the plurality of component holding members are capable of moving in one direction and in a reverse direction opposite to the one direction and, after being moved in the one direction, are capable of moving in the reverse direction opposite to the one direction with heights at which are located the plurality of component holding members being changed, and which is adapted to perform imaging of each of the plurality of components held by the plurality of component holding members during respective movement of the plurality of component holding members in the one direction and in the reverse direction; and
  a control unit which is adapted to recognize the surfaces to be recognized of only components having the surfaces to be recognized brought into a recognizable range of the recognition unit, from among the plurality of components.

BRIEF DESCRIPTION OF DRAWINGS

These and other aspects and features of the present invention will become clear from the following description taken in conjunction with the preferred embodiments thereof with reference to the accompanying drawings, in which:

FIG. 9 is a block diagram illustrating a positioning control configuration of a component mounting apparatus according to a second embodiment of the present invention;

DETAILED DESCRIPTION OF THE PREFERRED EMBODIMENTS

Figure 1:
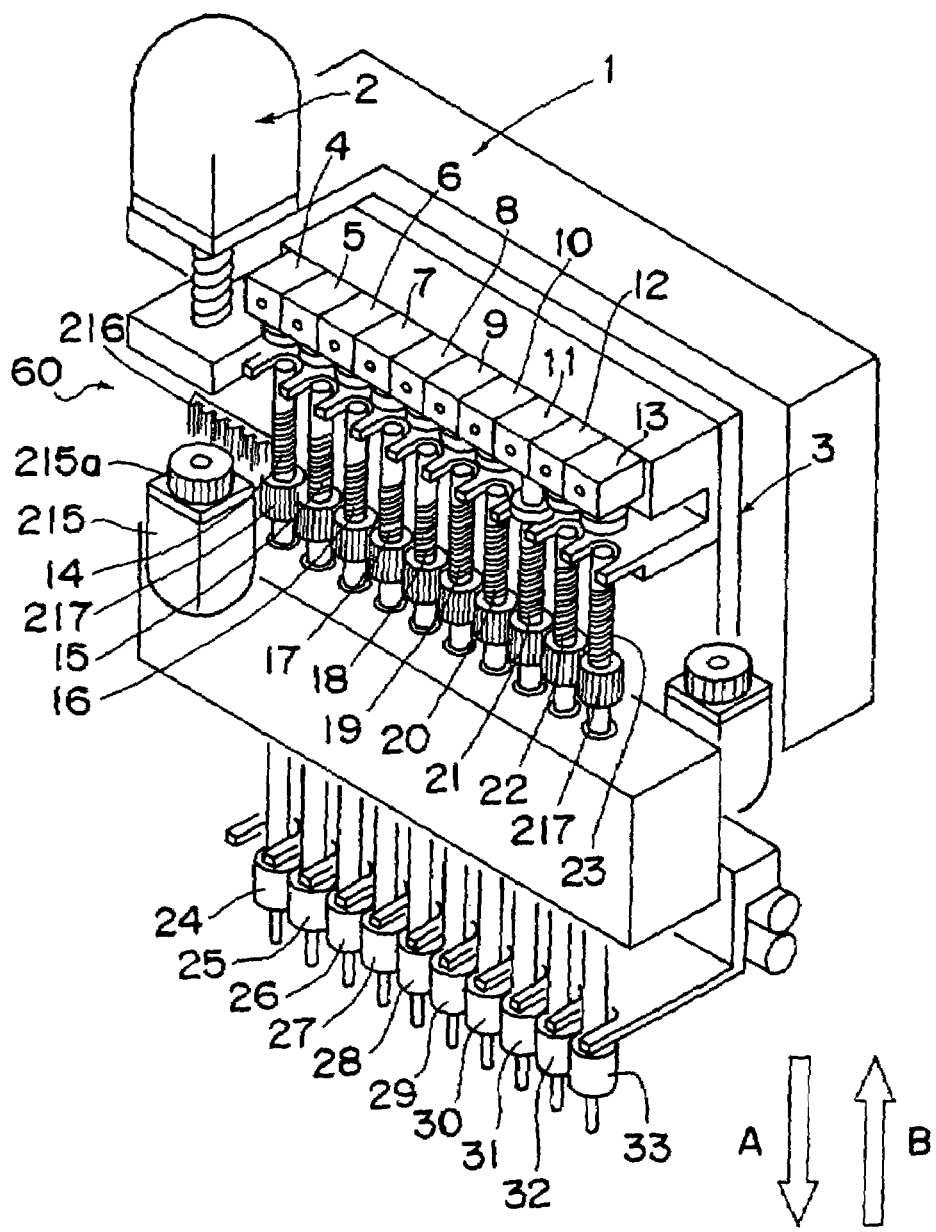
FIG. 1 is a perspective view of a component mounting apparatus showing a first embodiment of the present invention.

Before description of the present invention proceeds, it is to be noted that like parts are designated by like reference numerals throughout the accompanying drawings.

Embodiments of the present invention will now be described in detail with reference to the drawings.

First Embodiment

Hereinbelow, a component recognizing method and apparatus and a component mounting method and apparatus according to a first embodiment of the present invention will be described with reference to the drawings.

FIG. 1 illustrates the component mounting apparatus of the first embodiment of the present invention.

In FIG. 1, reference numeral 1 denotes a frame that serves as a foundation for a head unit 60, and the frame 1 is attached to a robot for driving the head unit and moves accompanying the robot. Numeral 2 denotes a vertical drive motor that is attached to the frame 1 and serves as a drive source. Numeral 3 denotes a table that is engaged with a rotating shaft composed of a ball screw of the motor 2 and moves vertically, i.e., in a direction A or a direction B relative to the frame 1 with a forward or reverse rotation of the rotating shaft of the motor 2, and the table 3 can be controlled so as to halt at an arbitrary position within a movable scope thereof. The table 3 corresponds to an L-type plate 318 shown in FIG. 23 that will be mentioned below, the table 3 is provided with a screwing portion which is similar to a screwing portion 317 provided in the L-type plate 318, and the screwing portion of the table 3 is engaged with the rotating shaft composed of the ball screw of the motor 2 so that the table 3 is moved up and down with a forward or reverse rotation of the rotating shaft of the motor 2 through the screwing portion of the table 3. Numerals 4 to 13 denote first to tenth cylinders which are fixed to the table 3 and function as drive transmitting units for selecting transmission of vertical movement of the table 3. Numerals 24 to 33 denote first to tenth nozzles which are supported by the frame 1 and have top ends capable of coming into contact with pistons of the first to tenth cylinders 4 to 13, upon movement of the pistons to their lowest positions, and suck and hold components to be installed. Numerals 14 to 23 denote first to tenth springs which continuously bias the first to tenth nozzles 24 to 33 in a downward direction, i.e., in the direction A and cause the nozzles to remain still.

Figure 7:
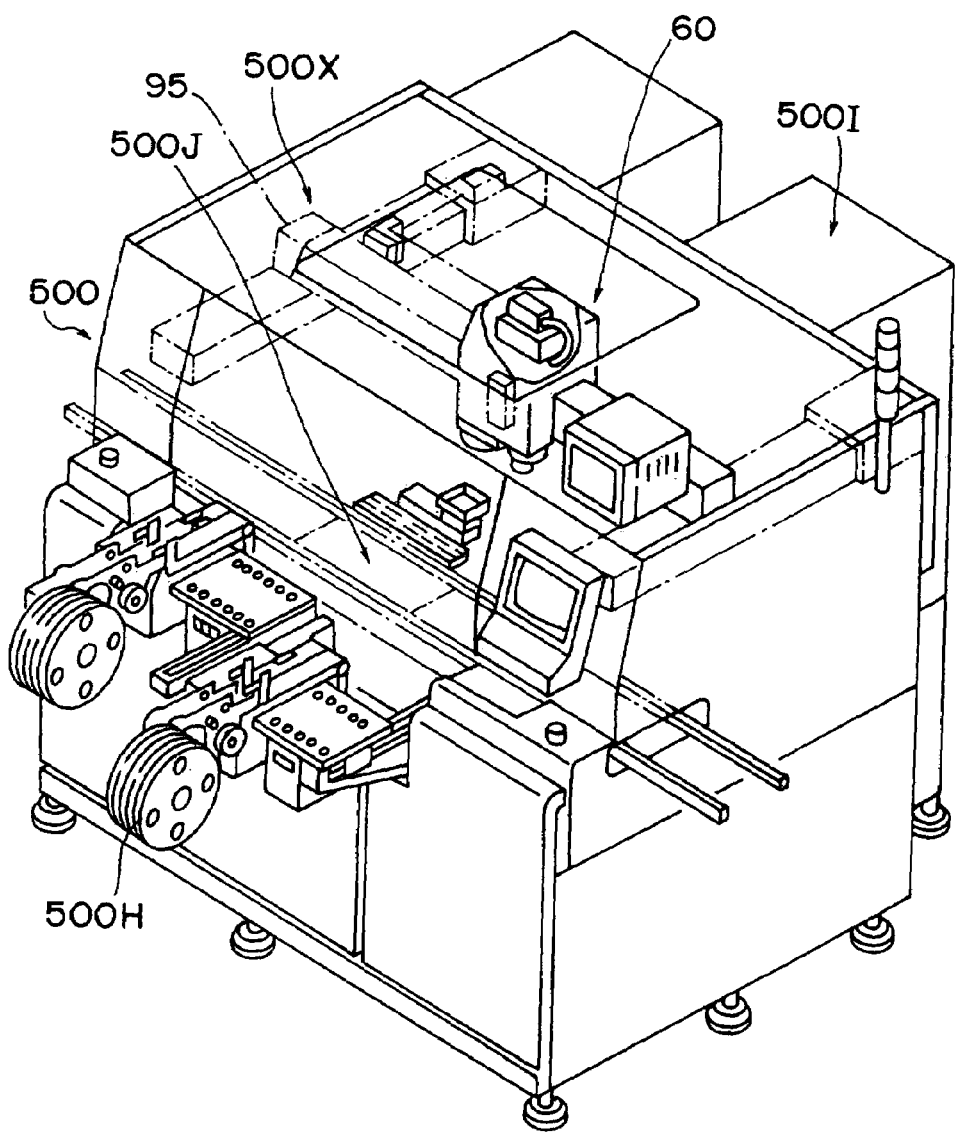
FIG. 7 is a general perspective view of component mounting equipment showing an embodiment of the present invention.

A configuration of component mounting apparatus 500 in which the head unit 60 is installed is shown in FIG. 7.

In such a component mounting apparatus 500 as shown in FIG. 7, for example, the head unit 60 is installed on an X-Y robot 500X for moving the head unit 60 in X-Y directions, and suction nozzles of the head unit 60 driven by the X-Y robot 500X suck and hold components fed from component feeding units 500H and 500I for production of a mounted board 500J and, after recognition of shapes of the components and correction of postures thereof, mount the components onto the board 500J. Reference numeral 95 in FIG. 7 denotes a head unit driving motor which drives the head unit 60 in the direction of Y axis of the X-Y robot 500X (in the direction of an arrow N in which the head unit moves (transverse direction)) so as to move the head unit, e.g., at constant velocity as will be mentioned below. During movement in the direction of Y-axis, components sucked and held by the suction nozzles, i.e., the first to tenth nozzles 24 to 33, are moved over a recognition camera 61 that will be mentioned below, and the components are recognized.

Figure 25:
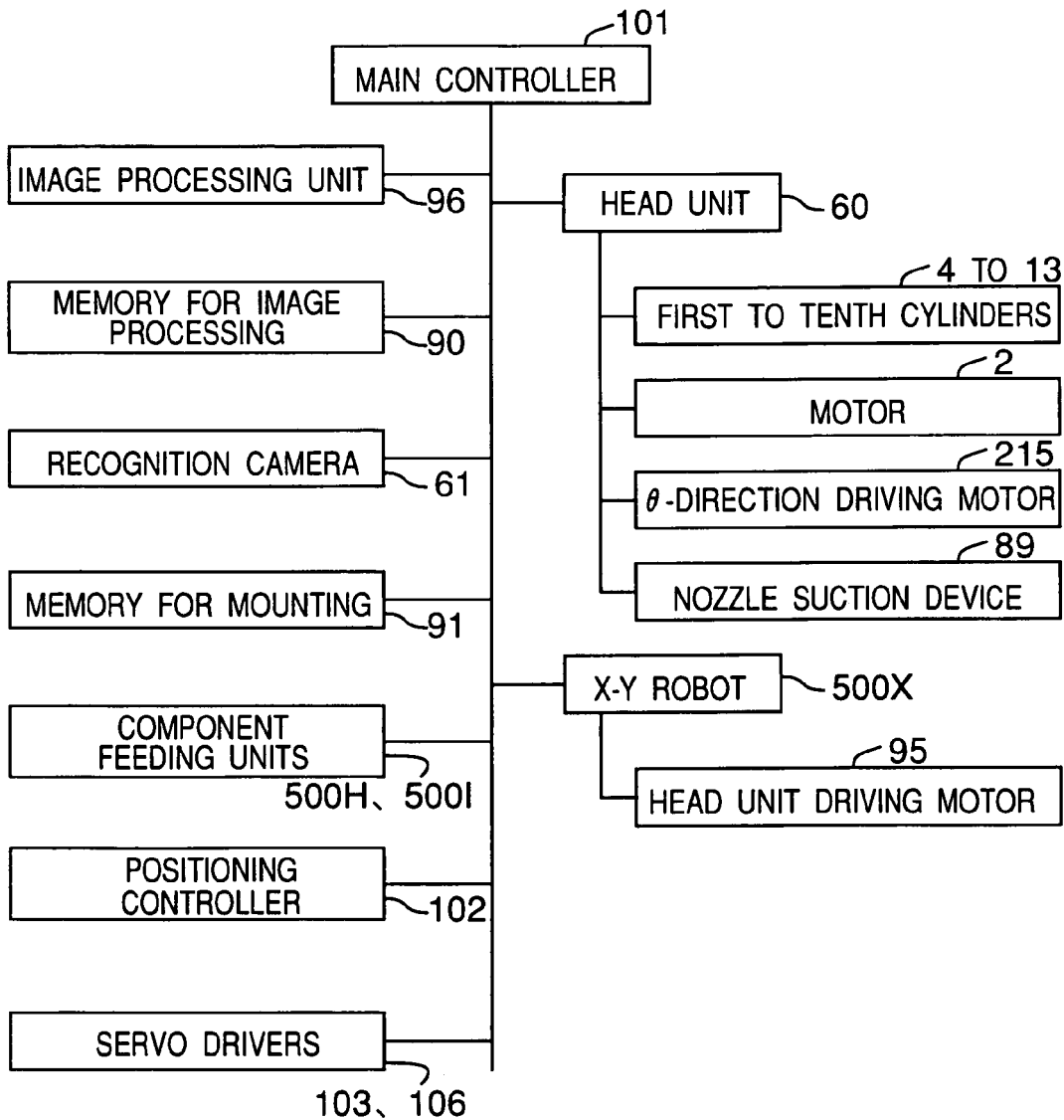
FIG. 25 is a block diagram illustrating relations between a control unit and a drive device and the like in the component mounting apparatus of the first embodiment and the second embodiment.

FIG. 25 shows relations between a control unit and a drive device and the like in the component mounting apparatus of the first embodiment. In FIG. 25, reference numeral 90 denotes a memory for image processing that captures both image data of components temporarily, numeral 91 denotes a memory for mounting that is stored with information including component data such as type, thickness, width, length, and weight of components used during component mounting, mounting order during suction and the like of components, types of nozzles installed in the head unit, and relations between the types of nozzles and the types of components (in other words, information instructing which nozzle may suck which component), numeral 96 denotes an image processing unit that performs recognition processing while controlling the recognition camera 61, and numeral 101 denotes a main controller as an example of the control unit. The main controller occasionally controls the image processing unit 96 and various drive devices or members such as the motor 2 and the head unit driving motor 95, and calculates a quantity of correction to a positional offset of an electronic component relative to a position in which the electronic component is to be sucked by a nozzle, from a result of recognition processing obtained from the image processing unit 96. The main controller 101 also controls various mounting operations such as feeding, suction, recognition, and installation of components throughout the component mounting apparatus. Reference numeral 89 in FIG. 25 denotes a nozzle suction device that controls sucking operations of the nozzles.

Hereinbelow, operations of the head unit 60 of the component mounting apparatus of the first embodiment under control of the main controller 101 will be described with reference to FIGS. 2A, 2B, 2C, and 2D. In FIGS. 2A, 2B, 2C, and 2D, only four nozzles out of ten, i.e., the first to fourth nozzles 24, 25, 26, and 27, from among the first to tenth nozzles 24 to 33, are shown for brevity.

In the head unit 60, forward or reverse rotational drive of the rotating shaft of the motor 2 provided on fixed frame 1 moves the table 3 vertically, motive power of this vertical movement is transmitted to nozzles corresponding to selected cylinders, from among the first to tenth nozzles 24 to 33, and the corresponding nozzles move vertically in response to the movement of the table 3, because driving forces of the selected cylinders, from among the first to tenth cylinders 4 to 13, overcome reactive forces of springs corresponding to the selected cylinders, from among the first to tenth springs 14 to 23, in an upward direction, i.e., in direction B. To be more specific, in a case that eighth nozzles 31 is moved vertically with vertical movement of the table 3 as shown in FIG. 1, for example, eighth cylinder 11 is driven to cause a bottom surface of the piston thereof to be in contact with a top end of the eighth nozzle 31, and then the vertical movement of the table 3 causes the piston of the eighth cylinder 11 and the eighth nozzle 31 to move vertically as one body against a reactive force of eighth spring 21. Nozzles corresponding to the cylinders not selected, i.e., nozzles to which drive is not transmitted, are not subjected to transmission of the vertical movement of the table 3 and remain still in same positions.

Figure 2A:
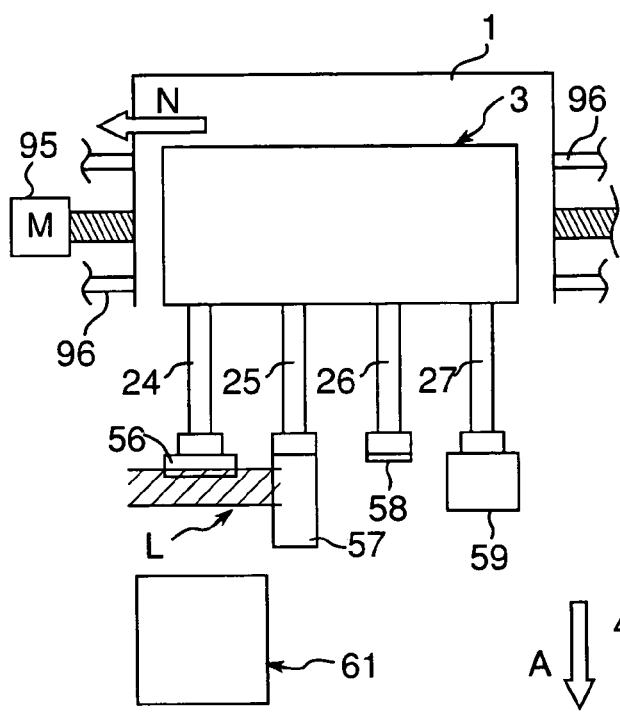
FIGS. 2A, 2B, 2C and 2D are explanatory drawings for explaining a positioning operation mode of the component mounting apparatus of FIG. 1.

In FIG. 2A, the first to fourth nozzles 24, 25, 26, and 27 hold components 56, 57, 58, and 59 having different heights and fed from component feeding units such as component feeding cassettes, and shapes, positions, and the like of the components are recognized with the recognition camera 61 as an example of a recognition unit in the order of the component 56, then the component 57, then the component 58, and then the component 59 while the head unit driving motor 95 (see FIG. 2A), in the robot for driving the head unit, drives the head unit 60 to move continuously, e.g., at constant velocity in the direction of the arrow N in which the head unit moves (transverse direction). At this time, in order that a surface to be recognized, e.g., the bottom surface of the component 56 of which the shape is to be firstly recognized, may come into a recognizable range L at commencement of recognition, the table 3 of the head unit 60 is moved vertically by the drive of the motor 2 and then a cylinder for the first nozzle 24 shown in FIG. 1 drives and lowers its piston to its lowest position so that the vertical movement of the table is transmitted to the first nozzle 24 and the position of the first nozzle 24 is adjusted in a direction A or in a direction B in FIG. 2A. Then the shape of the component 56 sucked and held by the first nozzle 24 remaining in its adjusted position is recognized. Reference numeral 96 in FIG. 2A denotes sliders for guiding the movement of the head unit 60 in the direction of the arrow N in which the head unit moves (transverse direction). With forward or reverse rotational drive of the head unit driving motor 95, the frame 1 screwed with a rotating screw shaft of the head unit driving motor 95 can be rectilinearly reciprocated in the direction of the arrow N while guided by the sliders 96.

Figure 2B:
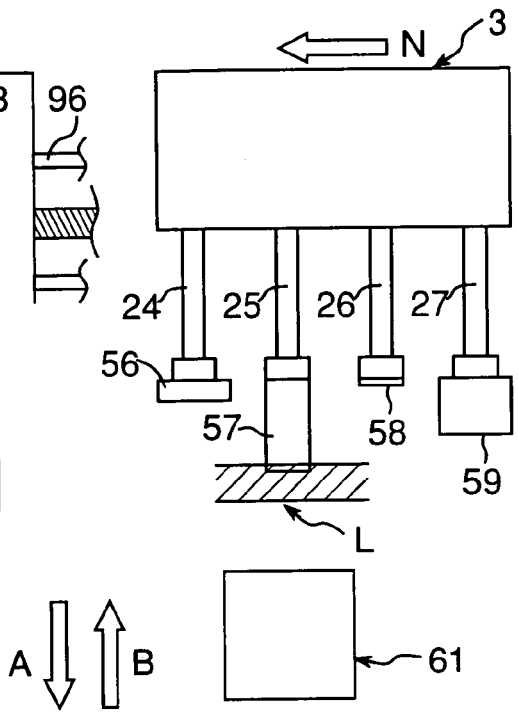

For recognition of the component 57 sucked and held by the second nozzle 25 in FIG. 2B, upon termination of shape recognition of the component 56, raising the table 3 of the head unit 60 in direction B with the drive of the motor 2 moves the second nozzle 25 upward in direction B so as to place a bottom surface of the component 57 into the recognizable range L, because the bottom surface of the component 57 is lower than that of the component 56. This raising operation is performed prior to the shape recognition of the component 57, and the bottom surface of the component 57 is in the recognizable range L of the recognition camera 61 at commencement of the shape recognition of the component 57, so that the shape recognition of the component 57 can be performed appropriately.

Figure 2C:
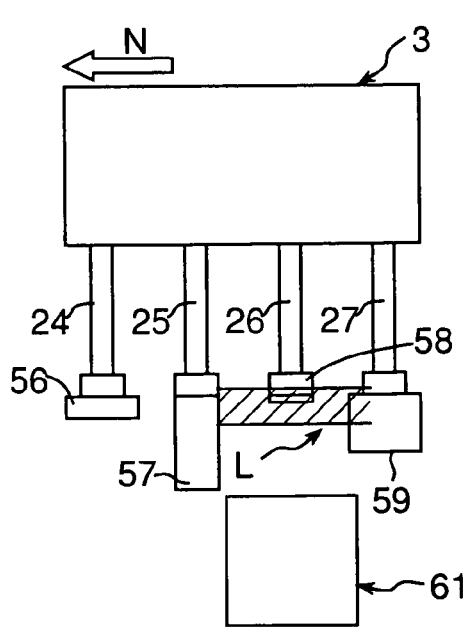

For recognition of component 58 sucked and held by the third nozzle 26 in FIG. 2C, upon termination of the shape recognition of the component 57, lowering the table 3 of the head unit 60 in direction A with drive of the motor 2 moves the third nozzle 26 downward in direction A so as to place a bottom surface of the component 58 into the recognizable range L, because the bottom surface of the component 58 is higher than that of the component 57. This lowering operation is performed prior to shape recognition of the component 58, and the bottom surface of the component 58 is in the recognizable range L of the recognition camera 61 at commencement of the shape recognition of the component 58, so that the shape recognition of the component 58 can be performed appropriately.

Figure 2D:
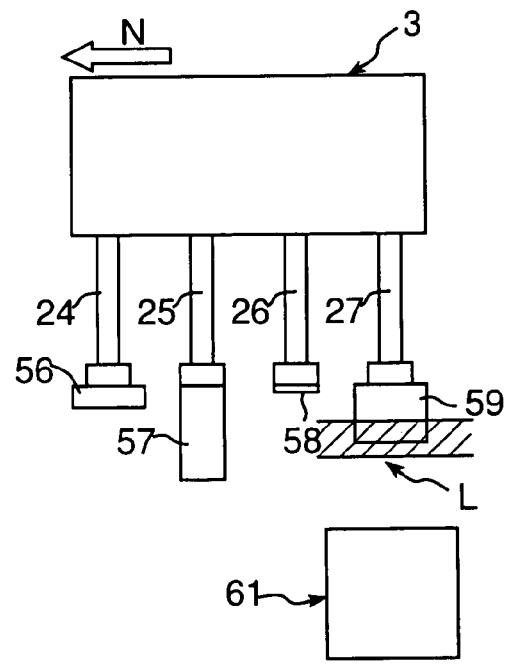
Figure 3:
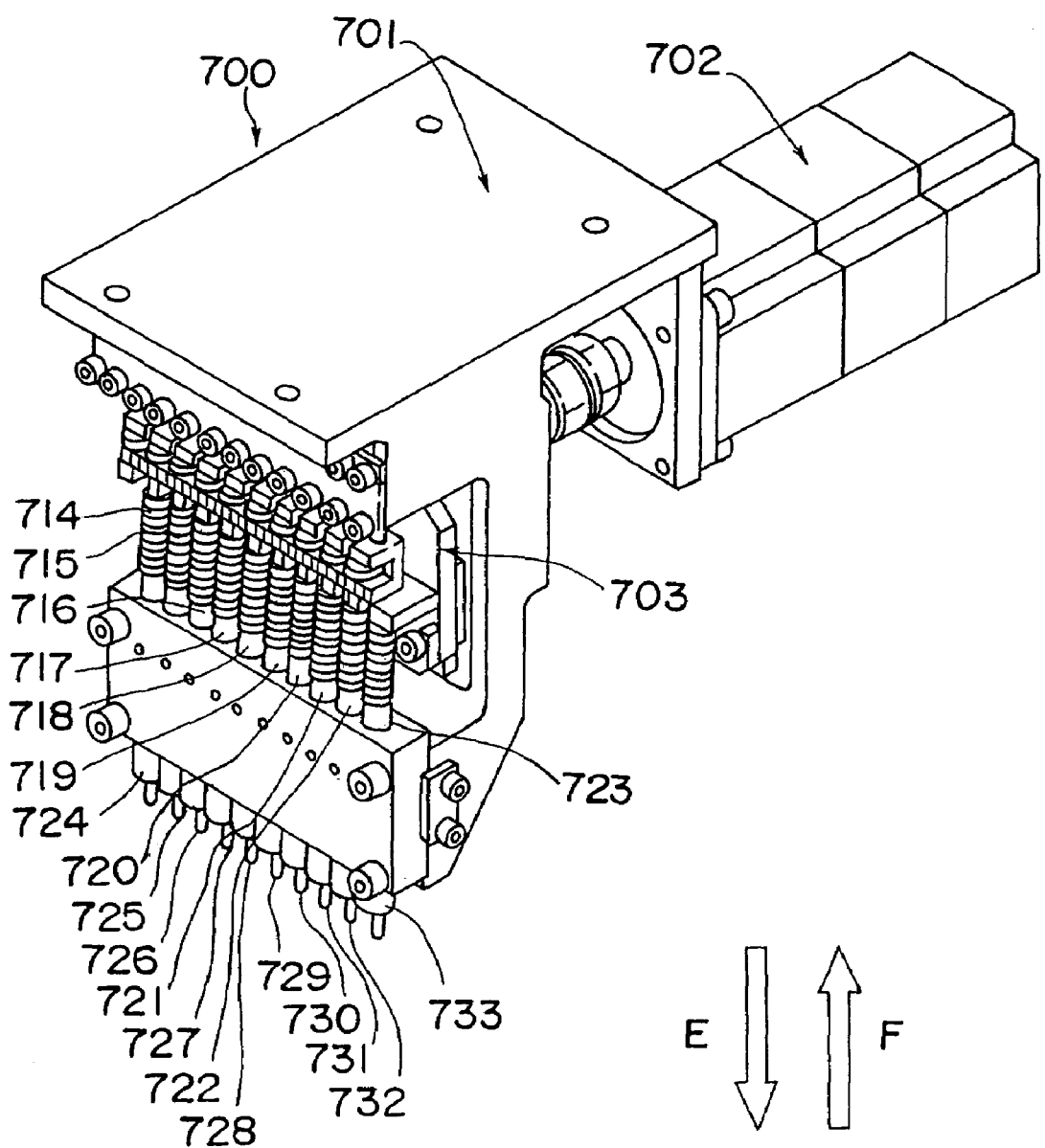
FIG. 3 illustrates a first prior art and is a perspective view of a component mounting apparatus thereof.
Figure 4A:
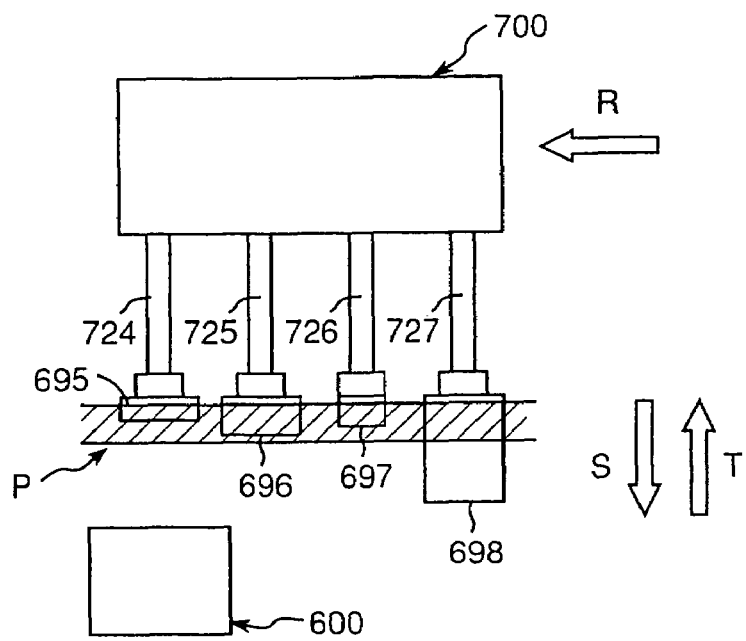
FIGS. 4A, 4B and 4C are explanatory drawings for explaining a positioning operation mode of the component mounting apparatus of the first prior art.
Figure 4B:
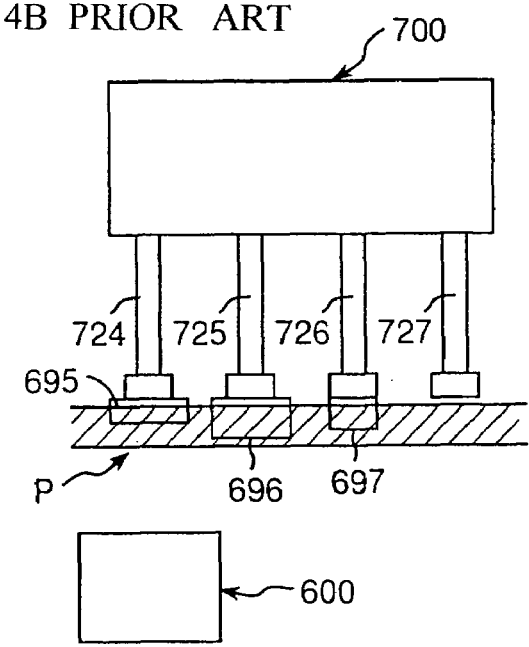
Figure 4C:
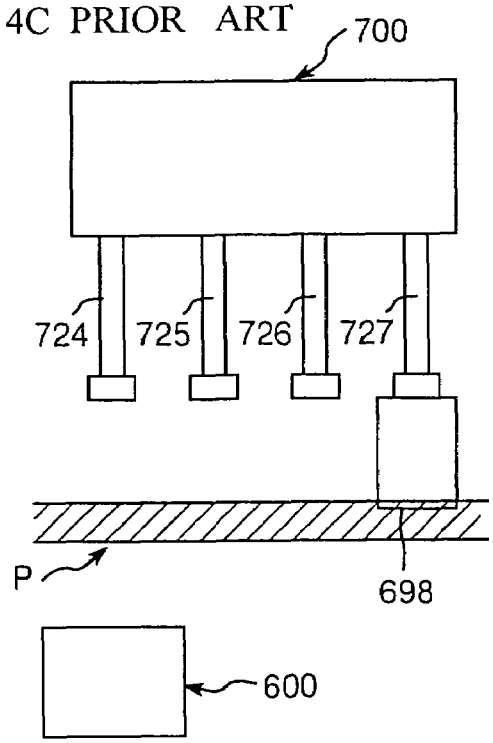
Figure 5:
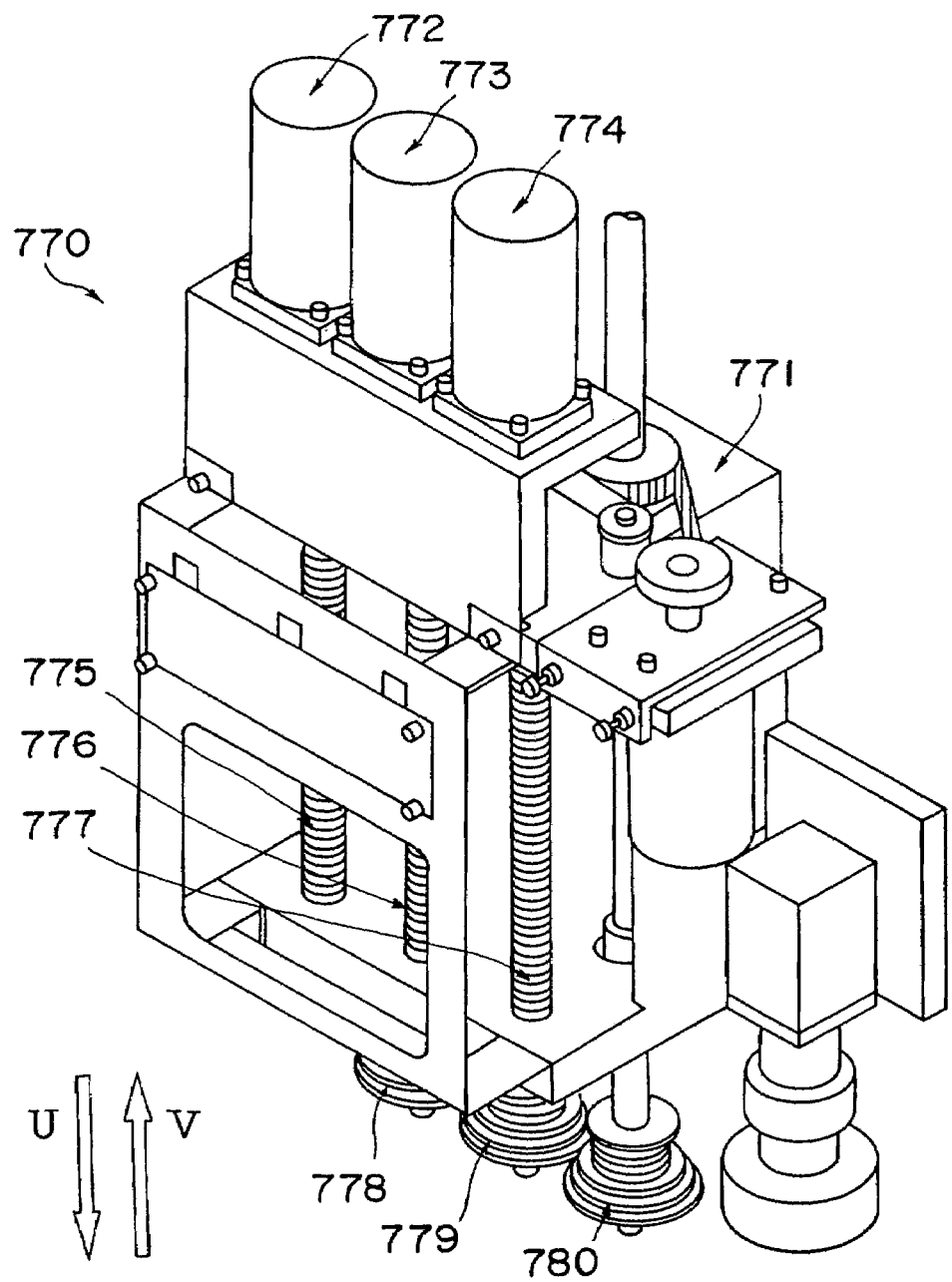
FIG. 5 illustrates a second prior art and is a perspective view of a component mounting apparatus thereof.
Figure 6:
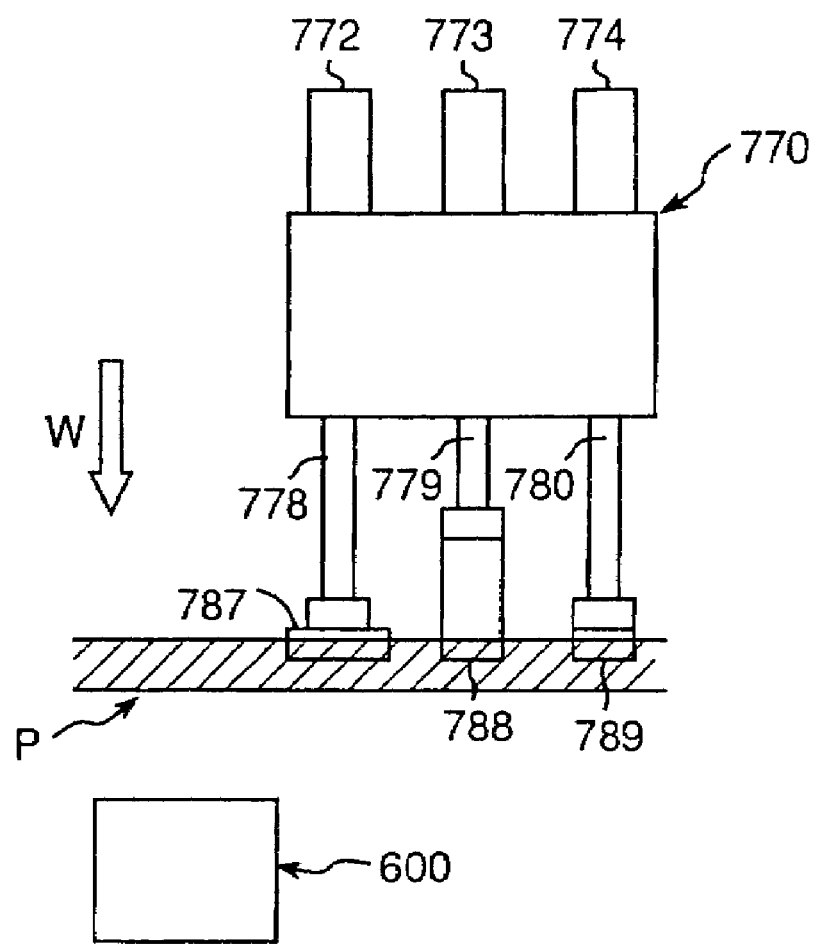
FIG. 6 is an explanatory drawing for explaining a positioning operation mode of the component mounting apparatus of the second prior art.

For recognition of the component 59 sucked and held by the fourth nozzle 27 in FIG. 2D, upon termination of the shape recognition of the component 58, raising the table 3 of the head unit 60 in direction B with drive of the motor 2 moves the fourth nozzle 27 upward in direction B so as to place a bottom surface of the component 59 into the recognizable range L, because the bottom surface of the component 59 is lower than that of the component 58. This raising operation is performed prior to shape recognition of the component 59, and the bottom surface of the component 59 is in the recognizable range L of the recognition camera 61 at commencement of the shape recognition of the component 59, so that the shape recognition of the component 59 can be performed appropriately.

After that, bottom surfaces of components sucked and held by other nozzles not shown in FIGS. 2A, 2B, 2C, and 2D are constantly adjusted and placed into the recognizable range L in the same way for component recognition, by vertical movement of the table 3 of the head unit 60 in direction A or in direction B, according to a height of a concerned component, between termination of shape recognition of a component preceding the concerned component and commencement of shape recognition of the concerned component, so that shapes of the components can be recognized continuously.

Upon accomplishment of this imaging, the image processing unit 96 performs recognition processing, on the basis of image data, of electronic components imaged by the recognition camera 61. After that, postures of the components sucked and held by the nozzles are corrected on the basis of a result of the recognition processing and then the components are installed (mounted) at predetermined positions on an object to be installed, such as a board.

For correction of postures of the components, the frame 1 is provided with a θ-direction driving motor 215 for correction in a rotational direction about nozzle shafts, i.e., in a direction θ, and forward or reverse rotation of a gear wheel 215a on a rotational shaft of the θ-direction driving motor 215 causes advance or retreat movement in a transverse direction of a rack 216 meshing with the gear wheel 215a and thereby causes forward or reverse rotations of gear wheels 217 fixed to the nozzles, so that all the nozzles can be rotated forwardly or reversely in unison in the direction θ.

A working example of the first embodiment is such an electronic component mounting apparatus as shown in FIG. 1, which vertically moves ten nozzles to perform continuous shape recognition of a maximum of ten electronic components having different heights and mounts onto a board a maximum of ten electronic components recognized and having different heights. Components of which shapes are recognized have heights, e.g., ranging from about one to a maximum of twenty five millimeters and, accordingly, vertical positions of the ten nozzles 24 to 33 are respectively controlled by the motor 2 and by the ten cylinders 4 to 13. A width of the recognizable range L in the direction of the heights is, for example, 0.5 mm, and therefore a mechanism that controls positions with a resolution of 0.01 mm or higher can be realized.

In accordance with the first embodiment, shapes, heights, and the like of the components 56 to 59 of which surfaces to be recognized are at different heights can be continuously recognized by moving the nozzles 24 to 33 of the head unit 60 vertically in general under control of the main controller 101 during component shape recognition in the component mounting apparatus, according to heights at which the surfaces to be recognized of the components to be recognized 56 to 59 are located. This arrangement eliminates repetition of a component recognizing operation in which, for example, only components having surfaces to be recognized at similar heights are held and recognized and, with this arrangement, components having surfaces to be recognized at different heights can be held at the same time and component recognizing operations can be performed continuously, regardless of the heights at which the surfaces to be recognized are located, so that an improvement in component mounting tact time (mounting process time) can be achieved. That is, even though the surfaces to be recognized of the components 56 to 59 held by a plurality of nozzles 24 to 33 cannot be accommodated all at once in the recognizable range L of the recognition camera 61, components having the surfaces to be recognized at different heights can be held at the same time and component recognizing operations can be performed continuously, by moving each of the nozzles 24 to 33 of the head unit 60 vertically so that each of the surfaces to be recognized of the components 56 to 59 comes into the recognizable range L.

Adjustment of heights at which components are located is achieved by the motor 2, i.e., a single drive unit, though such adjustment conventionally has required drive units of which a number of drive units corresponds to a number of nozzles, and thus cost and weight of the apparatus can be reduced.

Figure 8A:
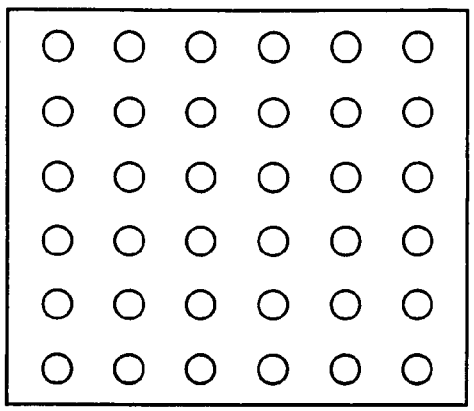
FIGS. 8A, 8B, 8C, 8D, 8E, 8F and 8G are views illustrating examples of components to be recognized.
Figure 8B:
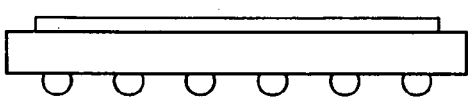
Figure 8C:
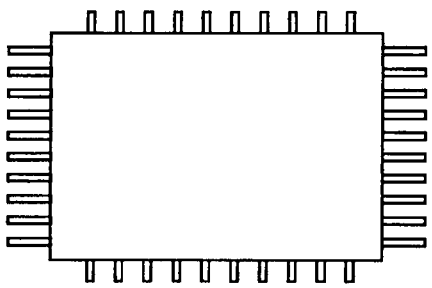
Figure 8E:
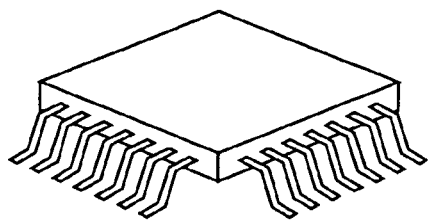
Figure 8D:
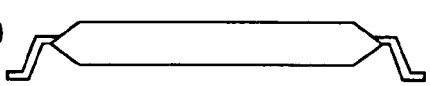
Figure 8F:
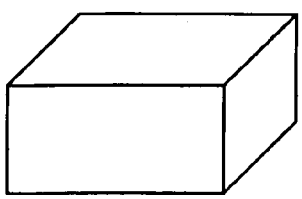
Figure 8G:
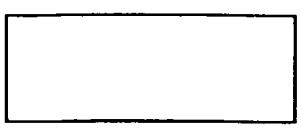

A surface of a component to be recognized by the recognition camera 61 is not confined to a bottom surface of the component. Examples of such a surface are as follows. In a component having protruding electrodes shaped like balls on its bottom surface, such as BGA (Ball Grid Array) and CSP (Chip Size Package) shown in FIGS. 8A and 8B, its surface to be recognized is not a bottom surface of a main body of the component but the balls themselves, and therefore it is necessary to detect heights (in a case of three-dimensional recognition camera) or shapes (in a case of two-dimensional recognition camera) of the balls. In a component having leads extending from a main body thereof, such as QFP (Quad Flat Package) shown in FIGS. 8C, 8D, and 8E, its surface to be recognized is not a bottom surface of the main body of the component but the vicinity of tips of the leads, and therefore it is necessary to detect heights (in a case of three-dimensional recognition camera) or shapes (in a case of two-dimensional recognition camera) of the leads. In such a chip component as shown in FIGS. 8F and 8G, its surface to be recognized is a bottom surface of a main body of the component, and therefore it is necessary to detect height (in a case of three-dimensional recognition camera) or shape (in a case of two-dimensional recognition camera) of the bottom surface of the main body of the component. In this manner, surfaces to be recognized of components to be recognized, e.g., a ball portion, a lead portion, and a bottom surface of the components may be situated at thoroughly different positions, even though surfaces of the components which are to be sucked by the nozzles, i.e., top surfaces of the components are situated at the same height. In accordance with the first embodiment, surfaces to be recognized of which location heights exhibit a variation can be recognized thoroughly during one operation of recognition.

Second Embodiment

Hereinbelow, a second embodiment of the present invention will be described with reference to the drawings.

For recognition of a height at which a surface to be recognized of a component is located in the first embodiment, the height at which the surface to be recognized of the component is located is required to be altered by a vertical movement in the event that the height at which the surface to be recognized of a sucked component is located differs from that of a formerly recognized component, and a positioning control apparatus and method according to the second embodiment of the present invention are capable of detecting accurately a starting time of driving vertical movement, i.e., positioning time. That is, the positioning control apparatus and method are such that an actuator, such as a servo motor corresponding to motor 2 of the drive unit, is driven to control a position of a load by a ball screw or the like serving as a rotating shaft of the motor 2, and a velocity curve is produced for positioning control with parameters, for example, of a target position, i.e., a height position where a surface to be recognized of a component is to be positioned by vertical movement of the surface, a maximum velocity during movement up to the target position, and a maximum acceleration during movement up to the target position. The positioning control apparatus and method are suitable for the component recognizing apparatus and method, and the component mounting apparatus and method, according to the first embodiment.

In other words, the positioning control apparatus and method according to the second embodiment are inexpensive and are capable of reducing a delay in a detection of a starting time of a positioning operation, and starting vertical movement at an arbitrary time, by providing parameters of a positioning operation starting position and specification of a shaft to be positioned and starting a positioning operation automatically upon arrival at the positioning operation starting position of the shaft specified by the shaft specification.

Herein, the term "operation starting position" refers to a position at which timing is provided for starting a vertical positioning operation to bring to within a recognizable range a surface to be recognized that is moving in a transverse direction, i.e., in N-direction in FIGS. 2A, 2B, 2C, and 2D, that is to say, a vertical drive starting position. When component 56 on the first nozzle 24 reaches a position in N-direction where recognition is completed, for example, during the transverse movement in N-direction, a vertical positioning operation for the second nozzle 25 is started to make a movement to a vertical position where component 57 on the second nozzle 25 can be recognized. The term "shaft specification" refers to specifying an actuator in N-direction. The term "to provide parameter" refers to notifying a shaft specification from the main controller 101 to a positioning controller 102.

For operation in vertical direction, the positioning control apparatus according to the second embodiment of the present invention produces, during the vertical movement, a velocity curve during vertical movement of a selected component holding member with parameters of a target position in a direction of height at a time when vertical movement of the selected component holding member is controlled by virtue of the drive unit so as to position a surface to be recognized of the component within a recognizable range of the recognition unit, a maximum velocity during the vertical movement of the selected component holding member up to a target position, and a maximum acceleration during the vertical movement of the selected component holding member up to the target position, and automatically starts a positioning operation of the selected component holding member driven by the drive unit on the basis of the velocity curve in response to a positioning operation starting instruction upon arrival at the positioning operation starting position of the selected component holding member moving transversely toward the recognition unit, so that the vertical operation can be started at an arbitrary time without delay in detection. Herein, the term "target position" refers to a terminal position of vertical movement, for example, a position in the direction of height in which the component 57 on the second nozzle 25 can be recognized, during ascent from a position for the first nozzle 24 to a position for the second nozzle 25. A positioning control apparatus according to a first aspect of the present invention is provided with parameters of a positioning operation starting position and a shaft specification, and automatically starts a positioning operation in response to a positioning operation starting instruction and upon arrival at the positioning operation starting position of a shaft specified by the shaft specification.

This arrangement ensures a positioning in which an arbitrary positioning operation starting time is provided accurately and in an inexpensive manner.

A positioning control apparatus according to a second aspect of the present invention is provided with parameters of a plurality of target positions and a plurality of positioning operation starting positions of the first aspect, and automatically starts a positioning operation in response to a positioning operation starting instruction and upon arrival at the positioning operation starting positions of a shaft specified by provided shaft specifications, and executes a plurality of positioning operations.

This arrangement ensures positioning in which an arbitrary positioning operation starting time is provided a plurality of times accurately and in an inexpensive manner, and ensures continuous positioning.

A positioning control apparatus according to a third aspect of the present invention has the second aspect provided with parameters of a plurality of positioning operation ending positions and detects normal accomplishment of individual positioning operations during a continuous operation.

This arrangement ensures detection of normal accomplishment of individual positioning operations during a continuous positioning operation and ensures an instantaneous suspension upon occurrence of an abnormal condition.

In a positioning control apparatus according to a fourth aspect of the present invention, an electronic component mounting apparatus is provided with the positioning control apparatus of the first aspect.

In a positioning control apparatus according to a fifth aspect of the present invention, an electronic component mounting apparatus is provided with the positioning control apparatus of the second aspect.

In a positioning control apparatus according to a sixth aspect of the present invention, an electronic component mounting apparatus is provided with the positioning control apparatus of the third aspect.

FIG. 9 is a block diagram illustrating a positioning control configuration that can be applied to the component mounting apparatus according to the second embodiment of the present invention. As shown in FIG. 9, this positioning control configuration has: a main controller 101 for outputting instructions of a target position (Pt) of a load, a maximum velocity (Vmax) during movement up to the target position, a maximum acceleration ($\alpha$max) during movement up to the target position, a positioning operation starting position (Pa), a shaft specification (A), and a positioning operation starting instruction (C); a positioning controller 102 that calculates a velocity curve on the basis of provided instructions to output an instructive velocity and functions as an example of a first control unit; servo drivers 103 and 106 that drive and control servo motors on the basis of the provided instructions and function as an example of a second control unit (for example, a transverse movement servo driver 103 (subjected to a positioning control in transverse movement) and a vertical drive servo driver 106, both for a plurality of suction nozzles (suction nozzles 211 in FIG. 17 that will be mentioned below and suction nozzles 24 to 33 in FIG. 18 that will be mentioned below) as an example of a plurality of component holding members); servo motors 104 and 107 attached to mechanical devices (e.g., a transverse movement servo motor 104 and a vertical drive servo motor 107 for a plurality of suction nozzles (corresponding to, for example, the head unit driving motor 95 and the vertical drive motor 2 of the first embodiment, a transverse movement servo motor and a vertical drive actuator 212 in FIG. 17 that will be mentioned below, and a transverse movement servo motor and a vertical drive motor 2 in FIG. 18 that will be mentioned below)); and mechanical devices 105 and 108 to be finally positioned.

This configuration will be specifically described in correspondence to the first embodiment as follows. For the main controller 101, a target position (Pt) of a load in a vertical movement device for the nozzles (a device composed of the motor 2, the table 3, the first to tenth cylinders 4 to 13, and others) is a target position at a time when vertical movement of a selected component holding member such as a nozzle is controlled by virtue of the drive unit so as to position a surface to be recognized of the component within a recognizable range of the recognition unit, and a target position (Pt) of a load in a transverse movement device for the nozzles, i.e., a transverse movement device for the head unit (a device composed of the transverse movement motor and others) is a vertical drive starting position for recognition of a surface to be recognized of the component within a recognizable range of the recognition unit, that is, a vertical drive starting position for the selected nozzle. A maximum velocity (Vmax) during movement up to the target position is a maximum velocity during vertical movement or transverse movement of the selected nozzle up to the target position. A maximum acceleration ($\alpha$max) during movement to the target position is a maximum acceleration during vertical movement or the transverse movement of the selected nozzle to the target position. The positioning operation starting position (Pa) is a starting position of a positioning operation in the direction of height and in a transverse direction of the selected nozzle driven by the motor 2 and the transverse movement motor. The shaft specification (A) is the selection of the selected nozzle. The positioning operation starting instruction (C) is a starting instruction of a positioning operation in the direction of height and in the transverse direction of the selected nozzle driven by the motor 2 and the transverse movement motor.

The above-mentioned term "load" refers to an actuator and its mechanical device that move the frame 1, which is a base of the table 3, as a load in the transverse direction, i.e., in horizontal direction (in the N-direction). That is, the load in the device for the transverse movement, i.e., the movement in the right-and-left direction is the frame 1, and the load in the device for the vertical movement is the table 3. The positioning controller 102 calculates velocity curves during both the vertical movement and the transverse movement of the selected nozzle on the basis of instructions provided by the main controller 101, and outputs velocity instructions based on these calculated velocity curves. The servo drivers 103 and 106 drive and control the servo motors on the basis of velocity instructions provided by the positioning controller 102, and correspond to the transverse movement servo driver 103 and the vertical drive servo driver 106 for a plurality of suction nozzles 24 to 33 as an example of a plurality of component holding members. The servo motors 104 and 107 attached to the mechanical devices correspond to the transverse movement servo motor and the vertical drive motor 2 for a plurality of suction nozzles. The mechanical devices 105 and 108 to be finally positioned correspond to the transverse movement device for transverse movement and the vertical movement device for the nozzles.

Figure 10:
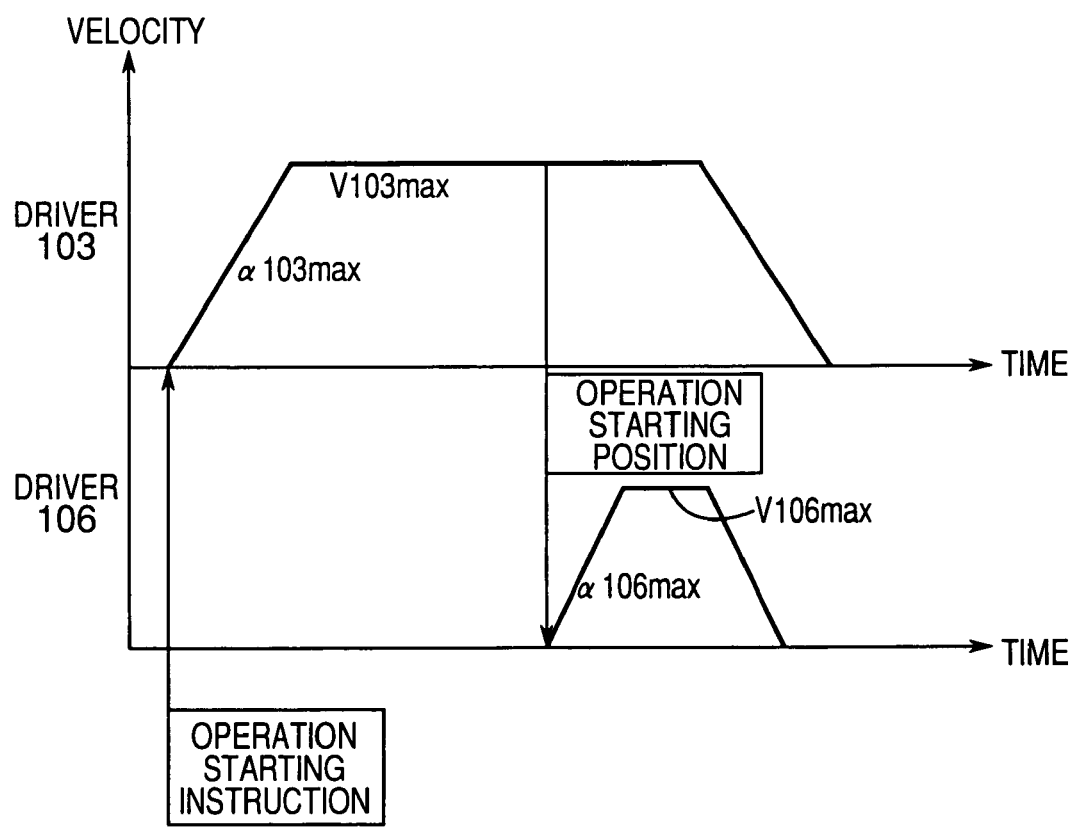
FIG. 10 is a diagram illustrating output of instructive velocities in the component mounting apparatus according to the second embodiment of the present invention.

Operations of calculation of the velocity curves and of output of an instructive velocity that are executed by the positioning controller 102 will be described below with reference to FIGS. 10 and 11.

The main controller 101 initially outputs for the transverse movement driver 103 instructions of a target position for transverse movement, a maximum velocity (V103max), and a maximum acceleration ($\alpha$103max) without providing instructions of a positioning operation starting position and a shaft specification (selection of a nozzle) for the driver 103, outputs for the vertical driver 106 instructions of a positioning operation starting position and a shaft specification and instructions of a target position for vertical drive, a maximum velocity (V106max), and a maximum acceleration ($\alpha$106max), and outputs a positioning operation starting instruction. The positioning controller 102 is then switched from a status (step #1 in FIG. 11) in which the controller 102 is waiting for a positioning operation starting instruction to following step #2, and determines whether there is a shaft specification or not (step #2 in FIG. 11).

Figure 11:
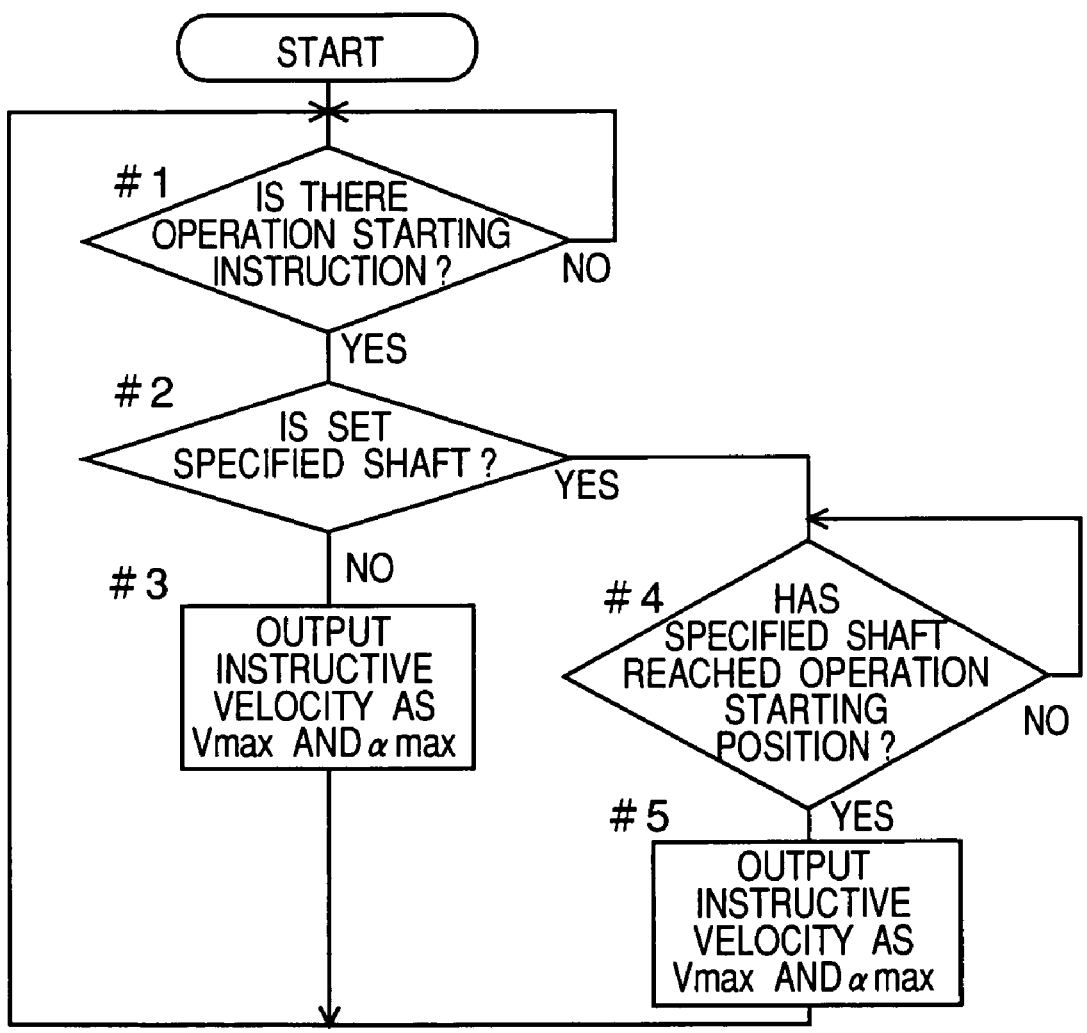
FIG. 11 is a flow chart of positioning operations in the component mounting apparatus according to the second embodiment of the present invention.

Next, the transverse movement driver 103 has no shaft specification and therefore goes from step #2 in FIG. 11 to step #3 in FIG. 11, and velocity instruction setting the maximum velocity (V103max) and the maximum acceleration (α103max) is outputted for the transverse movement driver 103 (step #3 in FIG. 11). On the basis of the velocity instruction setting the maximum velocity (V103max) and the maximum acceleration (α103max), the transverse movement driver 103 drives and controls the transverse movement servo motor to control transverse movement of each nozzle up to the target position that is a specified vertical drive starting position, and holds a posture of each nozzle that can be recognized by the recognition camera 61.

Next, the vertical driver 106 has a shaft specification that specifies a nozzle to be selected for selecting a nozzle to be vertically driven from among a plurality of nozzles, and therefore goes from step #2 in FIG. 11 to step #4 in FIG. 11, and waits for a specified shaft, i.e., a selected nozzle to reach the positioning operation starting position (step #4 in FIG. 11). Whether the nozzle has reached the positioning operation starting position or not can be detected by the positioning controller 102. That is, the positioning controller 102 controls the servo driver 103 for positioning of transverse movement in the N-direction, and therefore, the position in the N-direction and the positioning operation starting position can be detected by the positioning controller 102.

When the selected nozzle then reaches the positioning operation starting position, velocity instruction setting the maximum velocity (V106max) and the maximum acceleration (α106max) is outputted for the vertical driver 106 (step #5 in FIG. 11). Then, on the basis of the velocity instruction setting the maximum velocity (V106max) and the maximum acceleration (α106max), the vertical driver 106 drives and controls the vertical drive servo motor 2 to control vertical movement of each nozzle to a specified height as the target position so that a surface to be recognized of a component sucked by a concerned nozzle comes into the recognizable range L of the recognition camera 61.

After that, the positioning controller 102 is brought into a status (step #1 in FIG. 11) in which the following positioning operation starting instruction is waited for. That is, an instruction of vertical movement or transverse movement for a nozzle next selected is waited for in the status.

With this configuration, a positioning operation of each selected nozzle can be started accurately and in an inexpensive manner with arbitrary timing.

In accordance with the second embodiment, the positioning operation for a selected component holding member driven by the drive unit on the basis of the velocity curve is started automatically with a positioning operation starting instruction, upon arrival at a positioning operation starting position of the selected component holding member that has been moving transversely toward the recognition unit, and therefore, the positioning operation can be started accurately and in an inexpensive manner with arbitrary timing.

The present invention is not limited to the above embodiments but may be implemented in other various forms.

Figure 12:
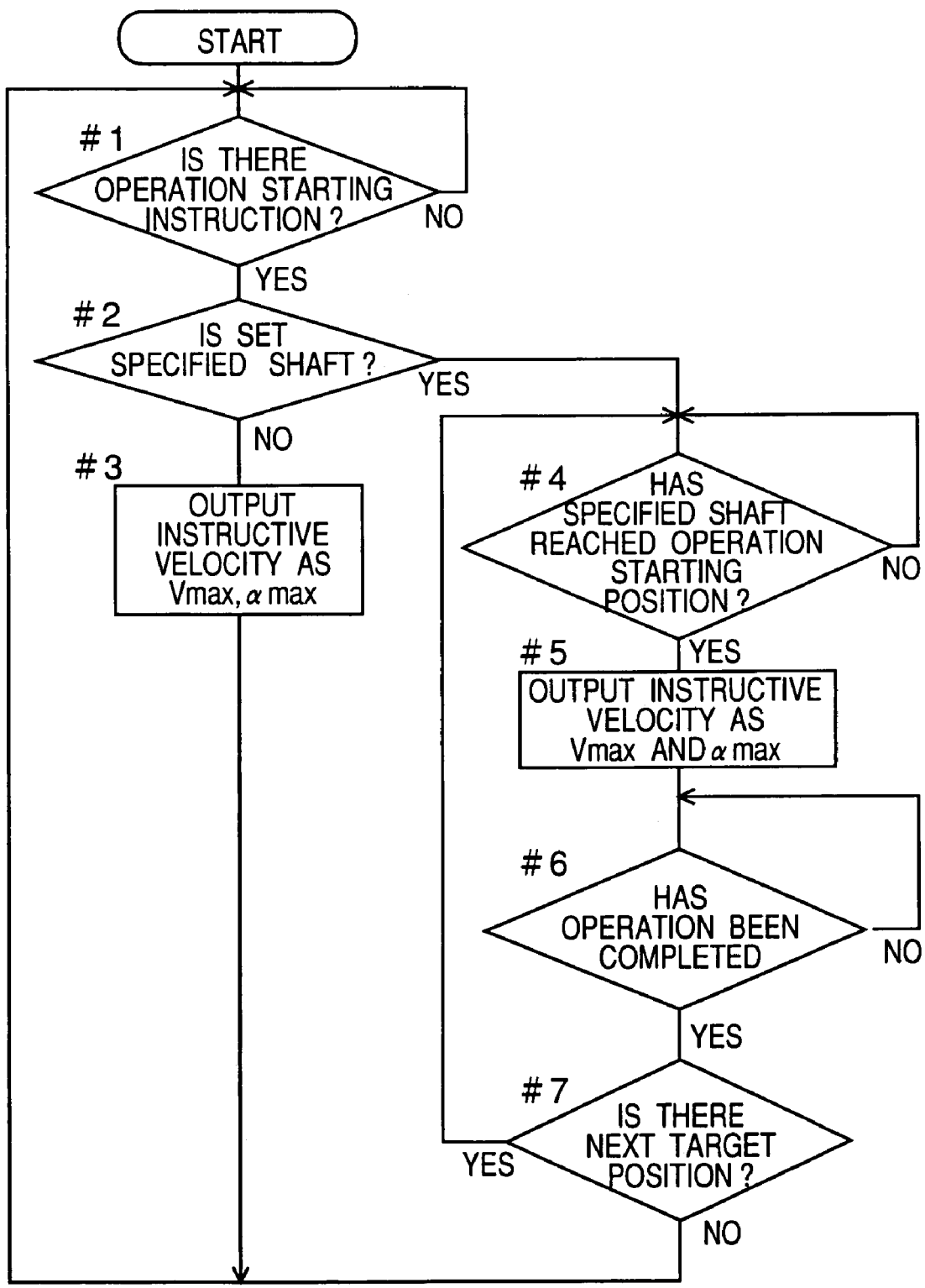
FIG. 12 is a flow chart of positioning operations in a component mounting apparatus according to a modification of the second embodiment.
Figure 14:
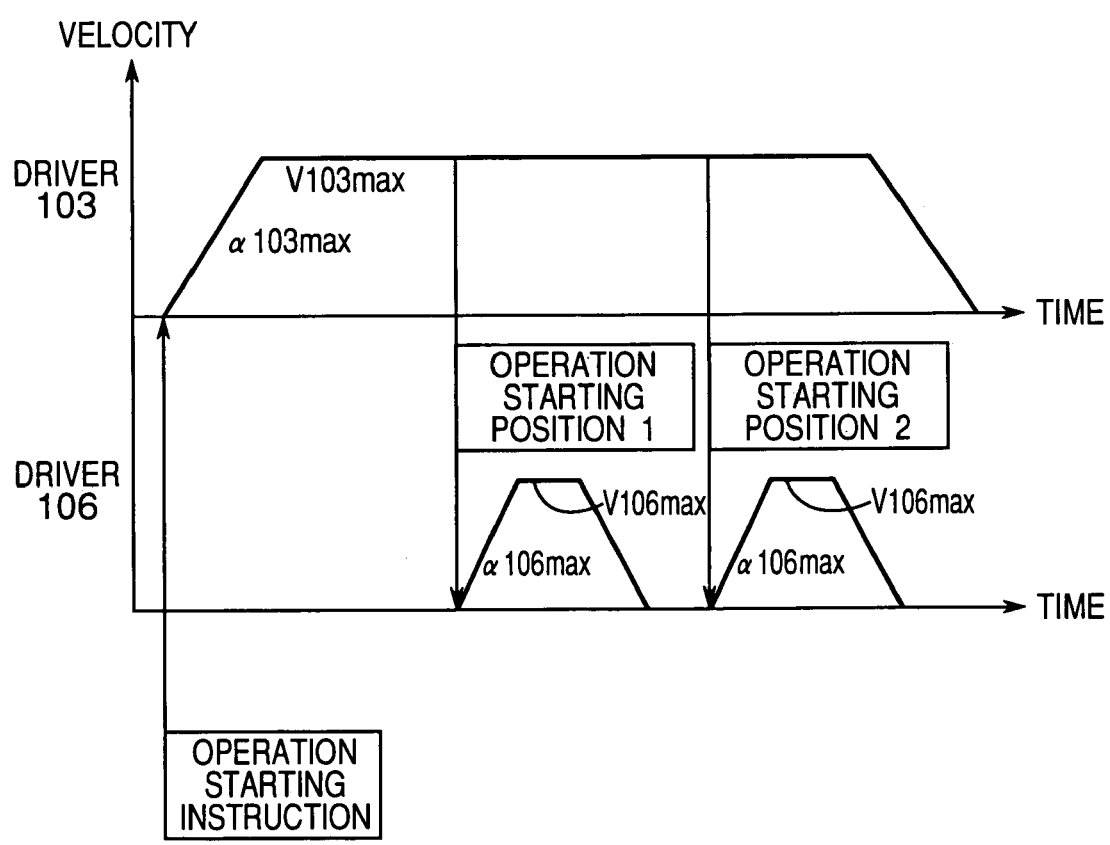
FIG. 14 is a diagram illustrating output of instructive velocities during the positioning operations of FIGS. 12 and 13.

For example, a plurality of parameters of target positions and positioning operation starting positions may be provided for executing processes shown in FIG. 12. That is, a positioning operation may be started from one positioning operation starting position in step #6, whether the positioning operation has been completed or not may be thereafter detected, and advancement to step #7 may be made only if the positioning operation has been completed. If there is a next target position, a return to step #4 may be made and a positioning operation may be started from a next positioning operation starting position. If there is not the next target position in step #7, a return to step #1 may be made. With this arrangement, as shown in FIG. 14, continuous positioning operations can be executed accurately and in an inexpensive manner with arbitrary timing.

Figure 13:
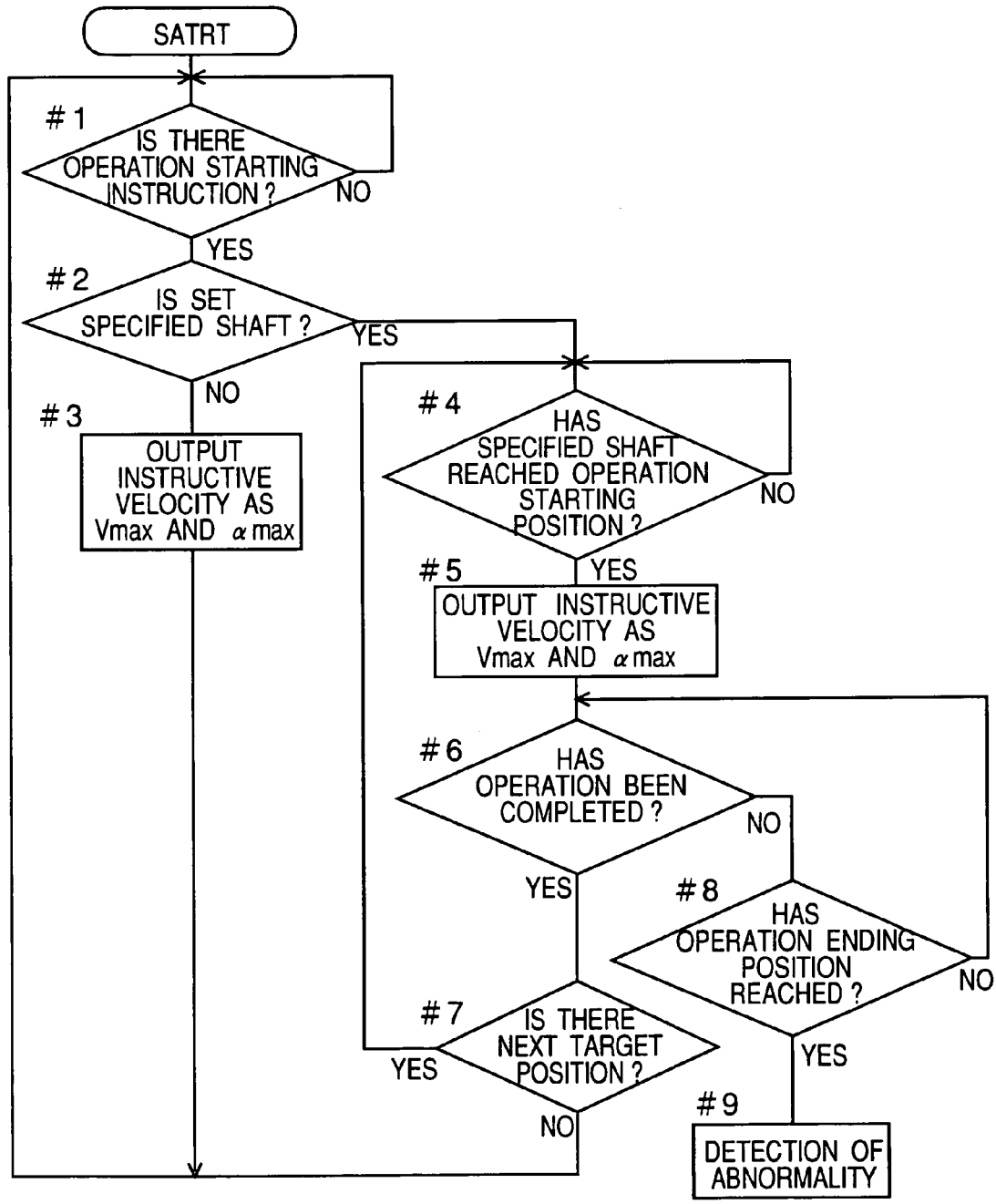
FIG. 13 is a flow chart of positioning operations in a component mounting apparatus according to another modification of the second embodiment.

On the other hand, a plurality of positioning operation ending positions may be added for executing processes shown in FIG. 13. That is, a positioning operation is started from a positioning operation starting position in step #6, whether the positioning operation has been completed or not is thereafter detected. If the positioning operation has not been completed, whether a positioning operation ending position has been reached or not is detected in step #8. If the positioning operation ending position has not been reached, a return to step #6 is made. If the positioning operation has not been completed and the positioning operation ending position has been reached in step #8, a detection of an abnormality is notified in step #9. An advance to step #7 may be made only if the positioning operation ending position has been reached in step #6. If there is a next target position, a return to step #4 may be made. If there is not the next target position, a return to step #1 may be made. With this arrangement, the fact that each positioning operation, of continuous positioning operations, has normally been completed can be detected. In this process, whether the positioning operation has been completed or not is judged (detected) according to termination of output of an instructive velocity or with an encoder (position detector) installed in the servo motor 104. Whether the positioning operation ending position has been reached or not is judged by controlling the vertical movement servo driver 106 in accordance with a position in N-direction. In other words, an ascent to a position for recognition of the second nozzle 25 is made in a position in N-direction (for example, a recognition ending position for the first nozzle 24), and whether the ascent has been completed before another position (e.g., a recognition starting position for the second nozzle 25) is judged. If the ascent has not been completed, an abnormality is detected (as a situation in which recognition is impossible).

With such a positioning control apparatus provided for or applied to an electronic component mounting apparatus, such as in the first embodiment, that requires positioning at high speed with high accuracy, positioning operations can be started accurately and in an inexpensive manner with arbitrary timing; however, it is needless to say that application is not limited to the above.

The second embodiment can be applied not only to a component mounting apparatus and method but to a positioning control apparatus and method for driving a plurality of actuators such as servo motors, and controlling positions of loads by a ball screw or the like, so that positioning operations can be started accurately and in an inexpensive manner with arbitrary timing. That is, an apparatus for driving a plurality of actuators such as servo motors and controlling positions of loads by a ball screw or the like can be configured so that the apparatus has the functions of producing a velocity curve with component recognizing apparatus parameters of a target position, a maximum velocity during movement up to a target position and a maximum acceleration during movement up to the target position, and starting a positioning operation in response to a positioning operation starting instruction. Parameters of a positioning operation starting position and a shaft specification are provided, a positioning operation is automatically started upon provision of a positioning operation starting instruction and upon arrival at the positioning operation starting position of a shaft specified by the provided shaft specification, and positioning is thereby executed with arbitrary timing.

That is to say, in a case that timing for starting positioning of one load must be provided according to position of another load, and the timing for starting the positioning must be changed during positioning control for driving actuators such as servo motors and controlling positions of loads by a ball screw or the like, a positioning operation of the other load is automatically started upon arrival of the position of one load at a positioning operation starting position, and a delay in detection is thereby reduced and the positioning operation can be started in an inexpensive manner with arbitrary timing. In a case that timing for starting the positioning of one load must be provided according to the position of the other load, for example, when operations of vertical movement and movement in a transverse direction, i.e., in a right-and-left direction, are made by virtue of the servo drivers 103 and 106, the motors 104 and 107, and the mechanical devices 105 and 108, the position in the right-and-left direction changes with sizes of components in a direction of height of the components, and in direction of movement to above the recognition device. A timing for starting the vertical movement accordingly changes and, therefore, a timing for starting positioning of the other load, e.g., in the vertical direction must be provided according to the position of one load, e.g., in the right-and-left direction in some cases.

As a result, a delay in detection can be reduced and a positioning control by which positioning operations are started in an inexpensive manner with arbitrary timing can be executed, by providing parameters of a positioning operation starting position and a shaft specification, and starting automatically a positioning operation upon arrival at the positioning operation starting position of a shaft specified by the shaft specification.

In such a configuration, a plurality of parameters of target positions and positioning operation starting positions may be provided so that continuous positioning operations can be executed accurately and in an inexpensive manner with arbitrary timing.

In such a configuration, furthermore, a plurality of positioning operation ending positions may be added so that normal completion of each positioning operation during continuous positioning operations can be detected.

In accordance with the second embodiment, the following issues can be resolved.

Figure 15:
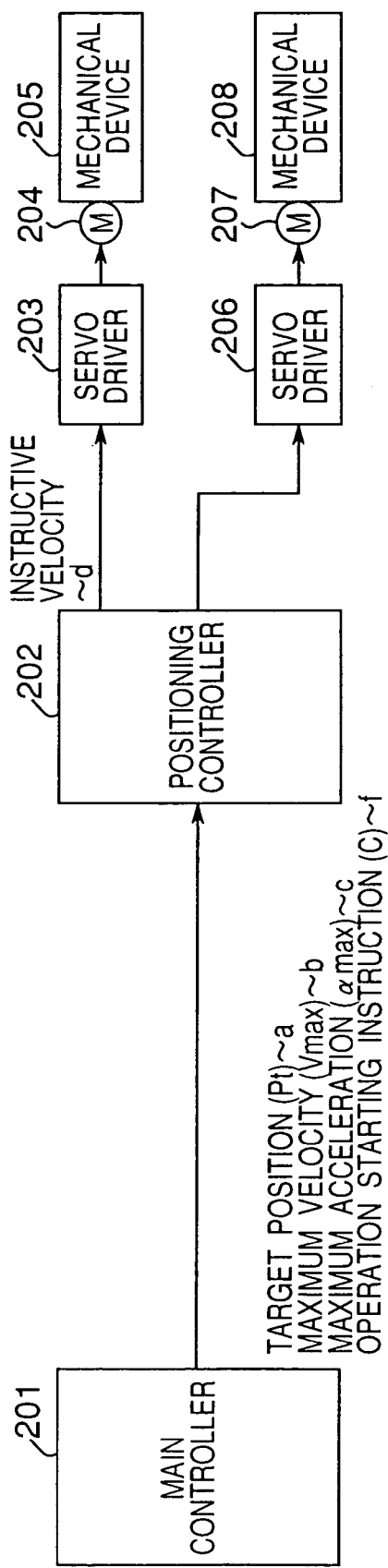
FIG. 15 is a diagram of a configuration of a conventional system.
Figure 16:
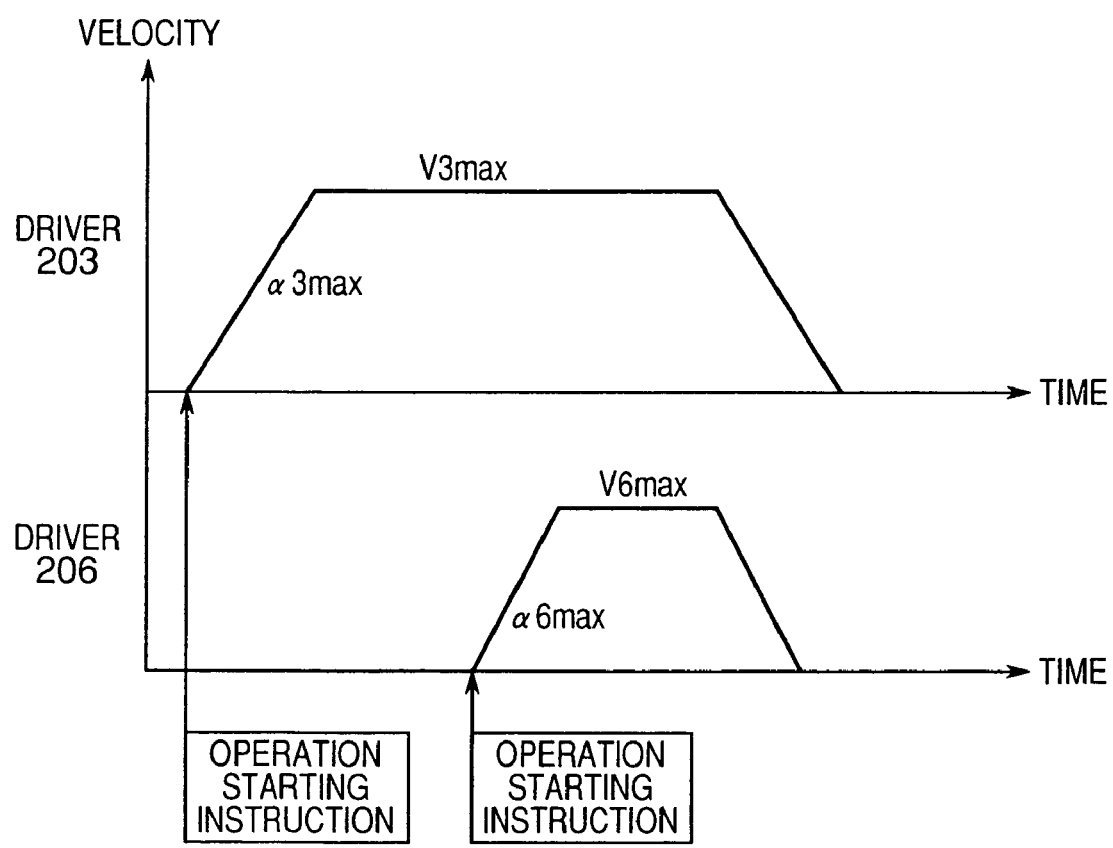
FIG. 16 is a diagram illustrating output of instructive velocities in the conventional system.

Conventionally, such a positioning control arrangement for a load, as shown in FIG. 15, is provided with: a main controller 201 for outputting a target position (Pt) of a load, a maximum velocity (Vmax) up to the target position, a maximum acceleration ($\alpha$max) up to the target position, and a positioning operation starting instruction (C); a positioning controller 202 that outputs an instructive velocity on the basis of provided instructions; a servo driver 203 that drives and controls a servo motor on the basis of a provided instructive velocity; a servo motor 204 attached to a mechanical device; and a mechanical device 205 to be finally positioned, and the positioning controller 202 is configured so as to output an instructive velocity on the basis of the provided instructions, as shown in FIG. 16.

Figure 17:
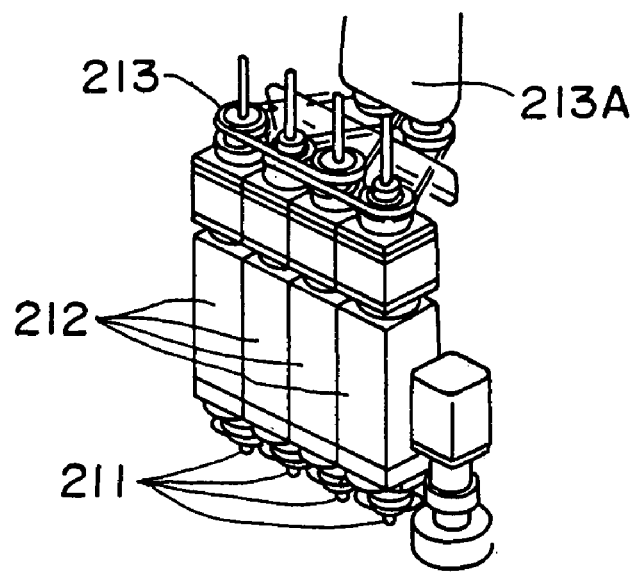
FIG. 17 is a view illustrating an example of a mechanical device.

As shown in FIG. 17, an electronic component mounting apparatus equipped with such a positioning apparatus for a load includes a plurality of component suction nozzles 211, . . . , 211 that suck and hold electronic components at component feeding units, such as component feeding cassettes, and install the components at installation positions on boards, and the plurality of component suction nozzles 211, . . . , 211 is provided with actuators 212, . . . , 212 such as servo motors serving as vertical movement devices, and a transverse movement device having a transverse movement servo motor A.

Figure 19A:
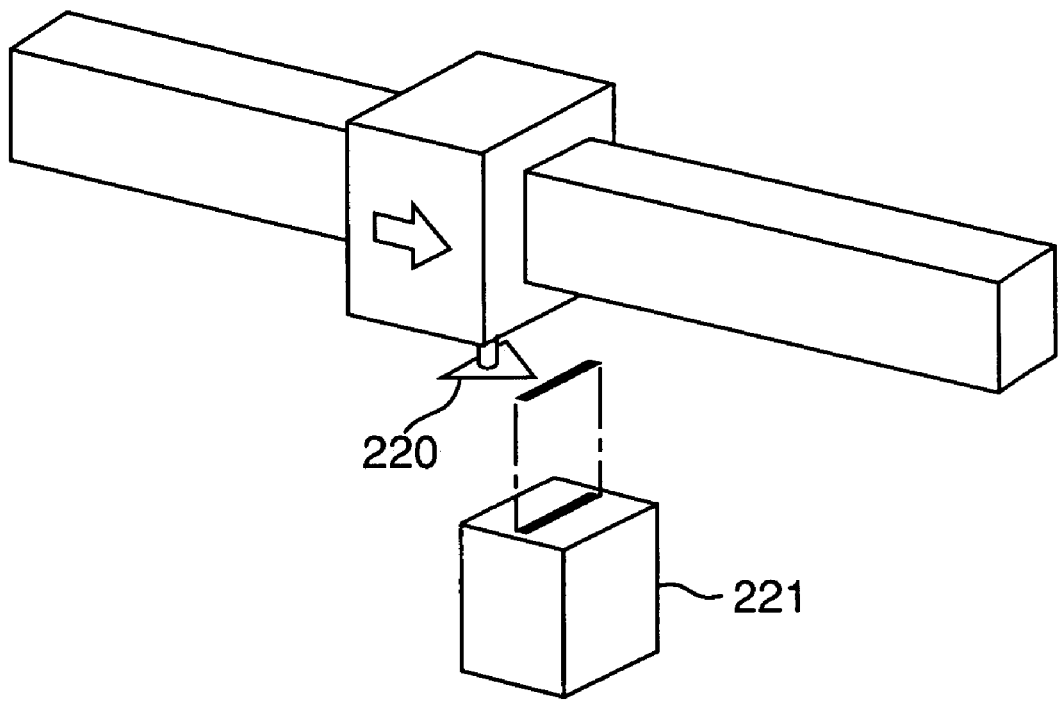
FIGS. 19A and 19B are views illustrating an example of a system for recognizing a component while moving the component.
Figure 19B:
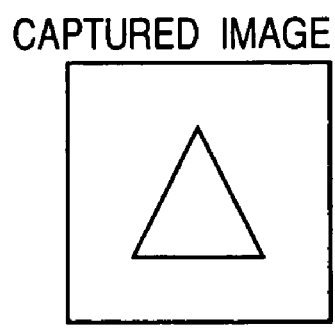

In recent years, particularly, mounting at high speed with high accuracy has been demanded, and there have been provided devices which recognize a plurality of components and install the components at a high speed by recognizing with a recognition unit 221 a shape and suction posture of a component 220 sucked and held by a nozzle while moving the nozzle or the like in the direction of an arrow, as shown in FIGS. 19A and 19B.

For recognition of height at which a surface to be recognized of a component is located, however, the height at which the surface is located when the component is moving is altered by a vertical movement device each time the height at which the surface to be recognized of the sucked component is located differs from that of the formerly recognized component. This operation requires a device for detecting a positioning timing of the vertical movement device, and a variation in timing for each component makes the device complicated and expensive and impedes a speed-up by a delay in detection.

According to the second embodiment, by contrast, a device for detecting a positioning timing of the vertical movement device is not required. Besides, positioning can be executed with arbitrary timing by producing a velocity curve with component recognizing apparatus parameters of a target position, a maximum velocity during movement up to the target position, and a maximum acceleration during movement up to the target position, providing a function of starting a positioning operation in response to a positioning operation starting instruction, providing parameters of a positioning operation starting position and a shaft specification, and starting the positioning operation automatically upon provision of a positioning operation starting instruction and upon arrival at the positioning operation starting position of a shaft specified by the provided shaft specification, and therefore, positioning operations can be started accurately and in an inexpensive manner with arbitrary timing.

Figure 18:
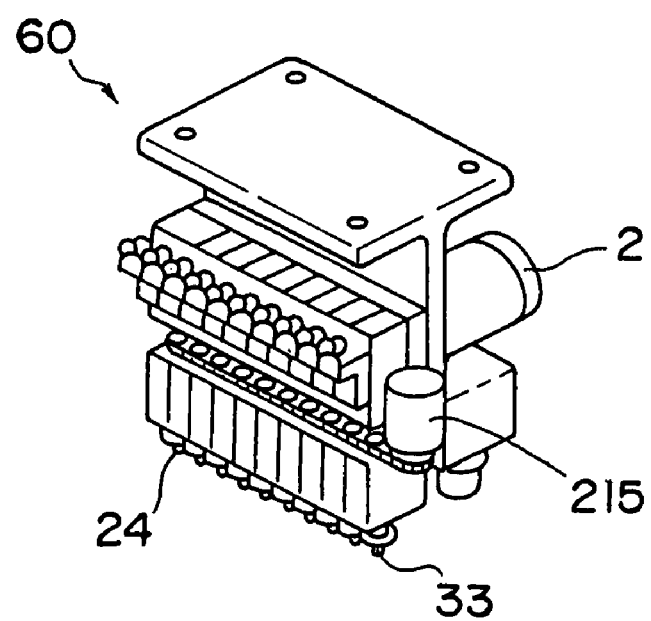
FIG. 18 is a view illustrating an example of a mechanical device.

For recognition of a height at which a surface to be recognized of a component is located, particularly in a component mounting apparatus which has an increased number of nozzles for a purpose of achieving a speed-up as described with regard to the first embodiment and as shown in FIG. 18, and which is equipped with actuators 14 to 33 for making vertical movement operations collectively and an actuator for making a transverse movement operation, e.g., a servo motor for transverse movement in an XY robot unit for driving a head unit, a device for detecting a positioning timing of a vertical movement device is not required and positioning operations can be preferably started accurately and in an inexpensive manner with arbitrary timing, when a height at which a surface is located to be recognized of a component that is moving is altered by the vertical movement device each time the height at which the surface is located to be recognized of a sucked component differs from that of a formerly recognized component.

Third Embodiment

Hereinbelow, a component recognizing method and apparatus, and a component mounting method and apparatus according to a third embodiment of the present invention will be described with reference to the drawings.

Prior to description of the third embodiment, an object of the embodiment will be described.

In recent years, high productivity in electronic component mounting apparatus for mounting electronic components onto circuit boards has been demanded with miniaturization and an increase in a variety of electronic components, and with an increase in an amount of electronic components to be mounted. In particular, a further speed-up in recognition of electronic components and in positional correction of electronic components has been demanded.

There have been known electronic component mounting apparatus having a component feeding unit for feeding electronic components, a head unit equipped with nozzles for sucking and holding electronic components, a drive device for moving the head unit to a specified position, a component mounting area having circuit boards on which electronic components are to be mounted, and a recognition area equipped with a line sensor for imaging a holding status of electronic components.

Figure 22:
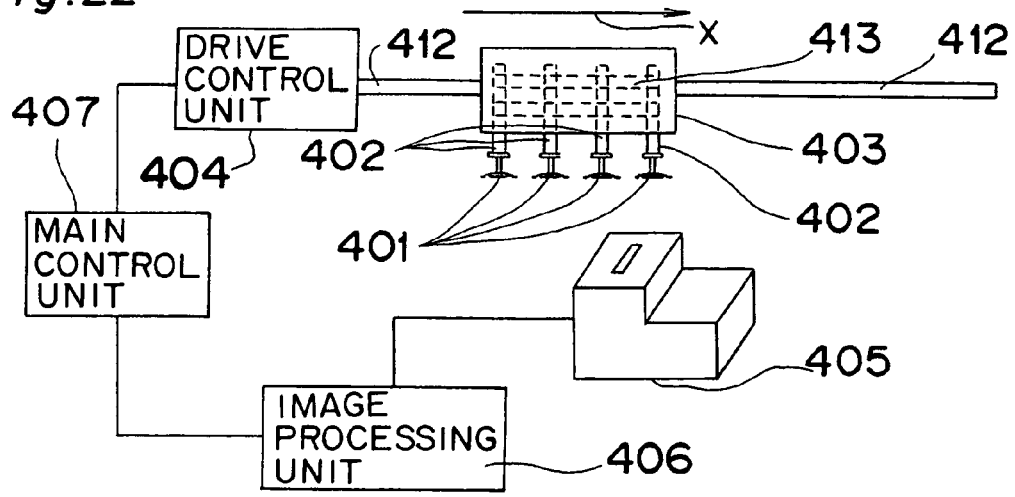
FIG. 22 is a diagram illustrating a basic configuration that is required for component recognition processes in an electronic component mounting apparatus.

In such an electronic component mounting apparatus, a component recognition process is configured as shown in FIG. 22. In FIG. 22, reference numeral 401 denotes electronic components, numeral 403 denotes a head unit equipped with a plurality of nozzles 402 (four nozzles in FIG. 22), numeral 412 denotes an X-Y drive device for moving the head unit 403 in X-Y directions, numeral 413 denotes a vertical drive device for moving the nozzles 402 vertically, numeral 404 denotes a drive control unit for controlling the X-Y drive device 412 and the vertical drive device 413, numeral 405 denotes a line sensor for imaging a holding status of the electronic components 401, numeral 406 denotes an image processing unit that performs recognition processing while controlling the line sensor 405, and numeral 407 denotes a main control unit that occasionally controls the image processing unit 406 and the drive control unit 404 and calculates a correction quantity for a positional offset of an electronic component 401 with respect to a nozzle suction position on the basis of a recognition processing result obtained from the image processing unit 406.

When the electronic components 401 are imaged by the line sensor 405, a height (a distance) from the line sensor 405 to a bottom surface of an electronic component 401 is preferably set so as to coincide with the focus of the line sensor 405. Therefore, heights of the nozzles 402 are required to be set so as to be changed in accordance with shapes of the electronic components 401, particularly in accordance with thicknesses of the components 401. Herein, the height (distance) is defined as a component holding height, and a component holding height that causes a component to be imaged and come into the focus of the line sensor 405 is defined as a focus coincident height. A component holding height can be changed by vertical movement of the nozzles 402 with use of the vertical drive device 413.

Operations of a component recognizing method according to a prior art with such a configuration will be described.

Four electronic components 401 are sucked and held by the head unit 403 equipped with four nozzles 402, and the head unit 403 is moved to a start position in a recognition area equipped with the line sensor 405. On the basis of the control by virtue of the main control unit 407, the drive control unit 404 moves the head unit 403 at a constant velocity in the X-direction over the line sensor 405 and a holding status of each of the four electronic components 401 is imaged, with component holding heights of the nozzles 402 set at a focus coincident height fit for the four electronic components 401. When imaging of all the electronic components 401 is completed, the image processing unit 406 performs recognition processing on the basis of image data of the electronic components 401. After that, the main control unit 407 calculates correction quantities with respect to mounting positions in a circuit board on the basis of a recognition processing result obtained from the image processing unit 406 and each electronic component 401 is installed on the circuit board.

For imaging a holding status of a plurality of electronic components 401 at one time during a series of component recognition processes, however, use of the above-mentioned method has to be limited to electronic components 401 which have similar thicknesses when sucked and held by the head unit 403. When imaging is performed in a state in which electronic components having greatly different thicknesses exist in a plurality of electronic components 401 sucked and held by the head unit 403, the focus of the line sensor 405 is situated at a fixed height. On the other hand, component holding heights of the nozzles 403 exhibit a variation according to the electronic components sucked and held and having different thicknesses, and therefore, some of the electronic components to be imaged are out of the focus of the line sensor 405 and the holding status cannot be imaged accurately.

For this reason, each group of electronic components having similar thicknesses must be separately subjected to all processes during component suction holding, component recognition, and component installation, and there arises an issue in productivity of component mounting because of an extra time for movement of the head unit 403 and an occurrence of empty nozzles which are sucking no components.

In view of the above-mentioned issue, it is an object of the third embodiment to permit a series of component recognition operations to be made at one time and accurately with electronic components having different thicknesses sucked and held by the head unit and, consequently, to increase productivity of component mounting by reducing extra time for movement of the head unit and minimizing an occurrence of empty nozzles.

Hereinbelow, the third embodiment of the present invention will be described in detail with reference to FIG. 20.

Figure 20:
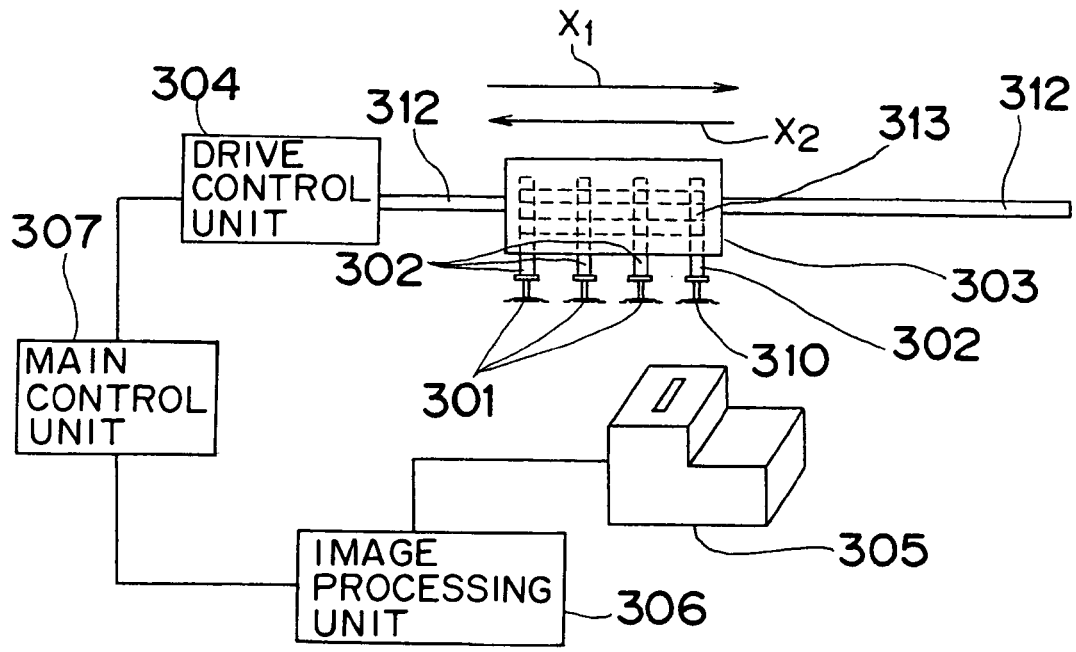
FIG. 20 is a diagram illustrating a basic configuration that is required for component recognition processes in an electronic component mounting apparatus of a third embodiment of the present invention.

In FIG. 20, reference numerals 301 and 310 denote electronic components, numeral 303 denotes a head unit equipped with a plurality of suction nozzles 302 (four nozzles in FIG. 20) as an example of component holding members, numeral 312 denotes an X-Y drive device (corresponding to the X-Y robot 500X in the first embodiment) for moving the head unit 303 in X-Y directions, numeral 313 denotes a vertical drive device for moving the nozzles 302 vertically, numeral 304 denotes a drive control unit for controlling the X-Y drive device 312 and the vertical drive device 313, numeral 305 denotes a line sensor as an example of a recognition unit for imaging a holding status of the electronic components 301 and the electronic component 310, numeral 306 denotes an image processing unit that performs recognition processing while controlling the line sensor 305, and numeral 307 denotes a main control unit that occasionally controls the image processing unit 306, the drive control unit 304, and various drive devices or members, and calculates correction quantities for positional offsets of the electronic components 301 and the electronic component 310 with respect to nozzle suction positions on the basis of a recognition processing result obtained from the image processing unit 306. The main control unit 307 also controls various mounting operations such as feeding, suction, recognition, and installation of components in the component mounting apparatus as a whole.

There is a difference in thickness, i.e., height in a vertical direction in FIG. 20, between the electronic components 301 and the electronic component 310. During imaging over the line sensor 305, accordingly, settings of component holding heights of the nozzles 302 differ between the electronic components 301 and the electronic component 310 which are sucked by the nozzles 302. This means that surfaces to be recognized, e.g., bottom surfaces of the electronic components 301 and 310 have such a variation in height that not all the surfaces are within a recognizable range (L) of the line sensor 305, for example, when bottom end surfaces of the nozzles 302 are situated at the same height. Herein, a component holding height of a nozzle 302 which is fit for imaging of the surfaces to be recognized, e.g., the bottom surfaces of the electronic components 301, is defined as a first focus coincident height. A component holding height of a nozzle 302 which is fit for imaging of a surface to be recognized, e.g., the bottom surface of the electronic component 310 is defined as a second focus coincident height.

The component holding heights of the nozzles 302 are made variable according to sucked and held electronic components with different thicknesses, for a purpose of correcting to a focus coincident height the component holding heights of nozzles 302 having sucked and having held electronic components of which the bottom surfaces as an example of surfaces to be recognized do not coincide with the focus of the line sensor 305; that is, reside nearer or farther than the focal position of the line sensor 305, according to thicknesses of the electronic components, in contrast to the focus of the line sensor 305 situated at a fixed height. In such an apparatus in which component holding heights are variable, heights can be changed by vertical movement of the nozzles 302 by virtue of the vertical drive device 313. Details of the vertical movement of the nozzles 302 and the vertical drive device 313 which are provided for the head unit 303 will be described later.

A direction shown by reference character X1 in FIG. 20 is a direction in which the head unit 303 moves at constant velocity with the nozzles 302 set at the first focus coincident height fit for scanning and imaging of the electronic components 301, and which is orthogonal to a longitudinal direction of the line sensor 305. A direction shown by reference character X2 in FIG. 20 is a direction in which the head unit 303 moves at constant velocity with the nozzles 302 set at the second focus coincident height fit for scanning and imaging of the electronic component 310, and which is a reverse direction opposite to the traveling direction X1 assumed as a forward direction of the head unit 303 (Both the directions X1 and X2 are included in X-direction.).

Figure 26:
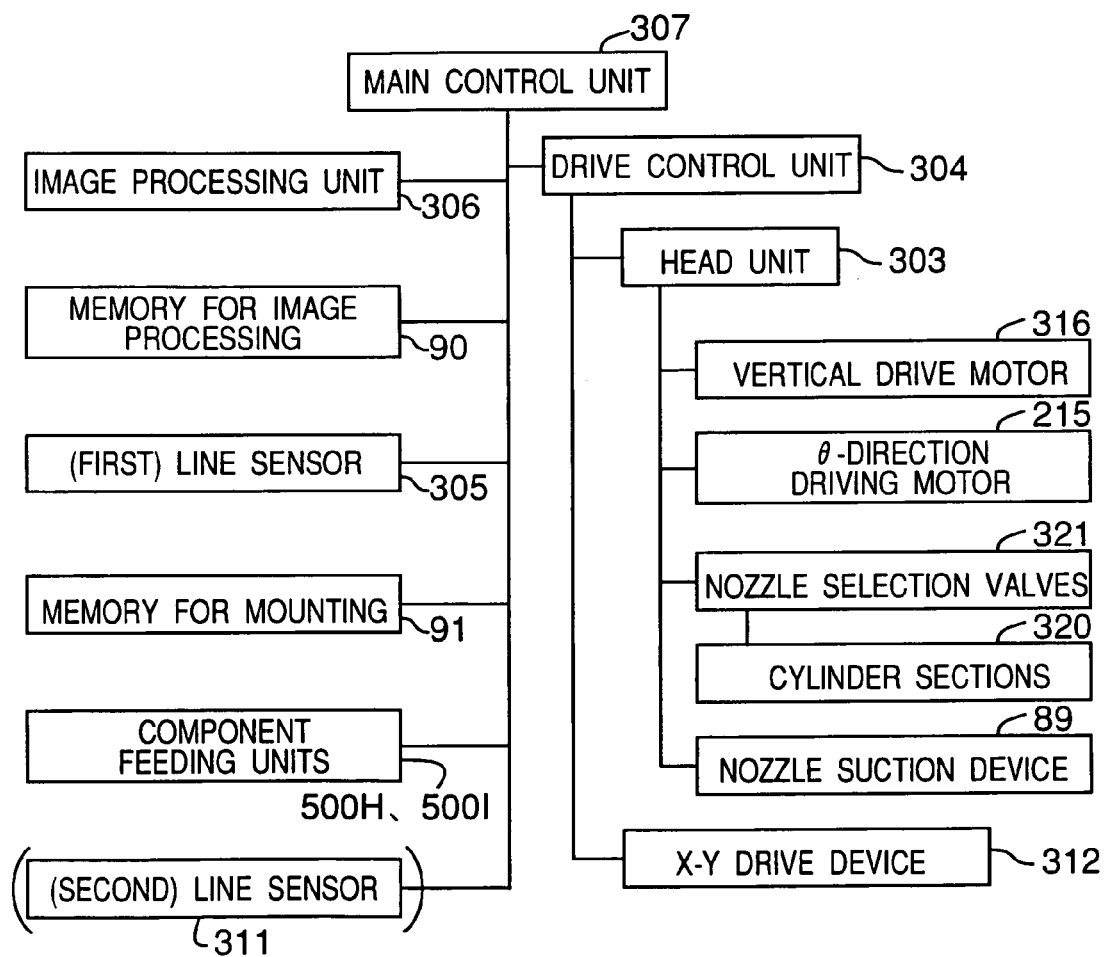
FIG. 26 is a block diagram illustrating relations between a control unit and a drive device and the like in the component mounting apparatus of the third embodiment and the fourth embodiment.

A configuration and operation concerning the vertical movement of a plurality of nozzles 302 provided for the head unit 303 will be described below with reference to FIG. 23. FIG. 26 illustrates relations between the control unit and the drive device and the like in the component mounting apparatus of the third embodiment.

Figure 23:
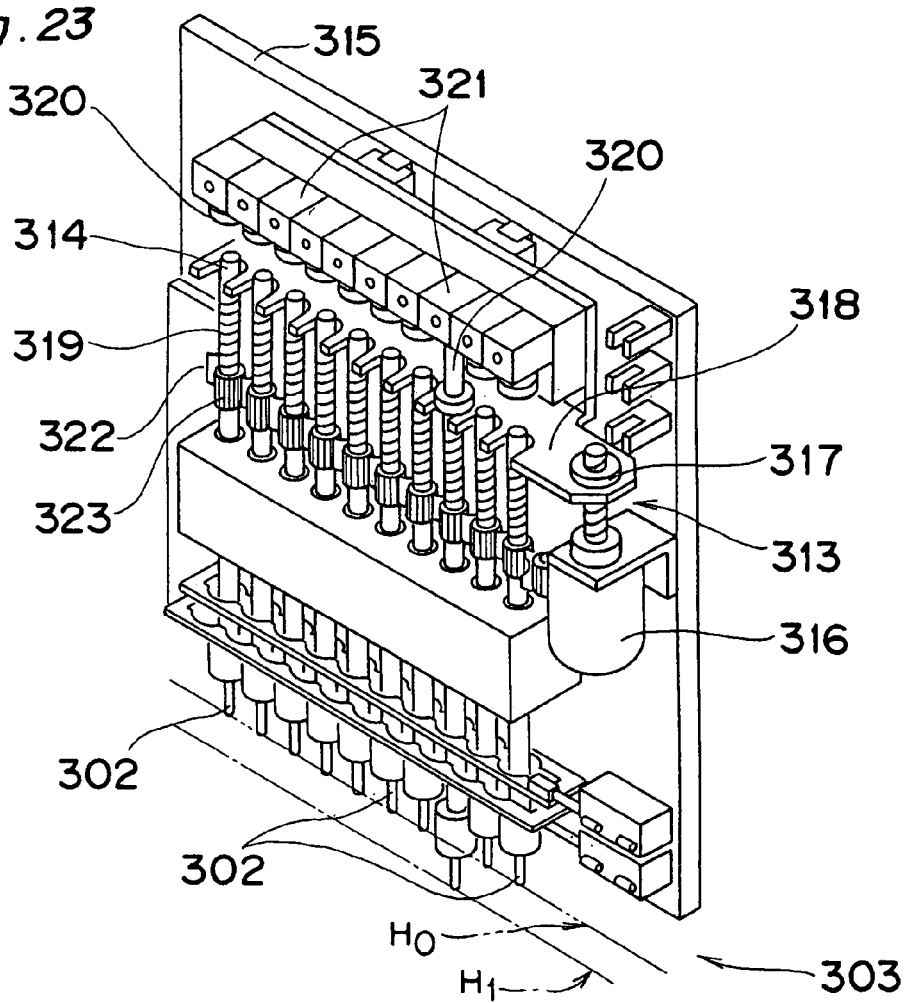
FIG. 23 is a perspective view of a head unit of the electronic component mounting apparatus of the third and fourth embodiments.
Figure 24:
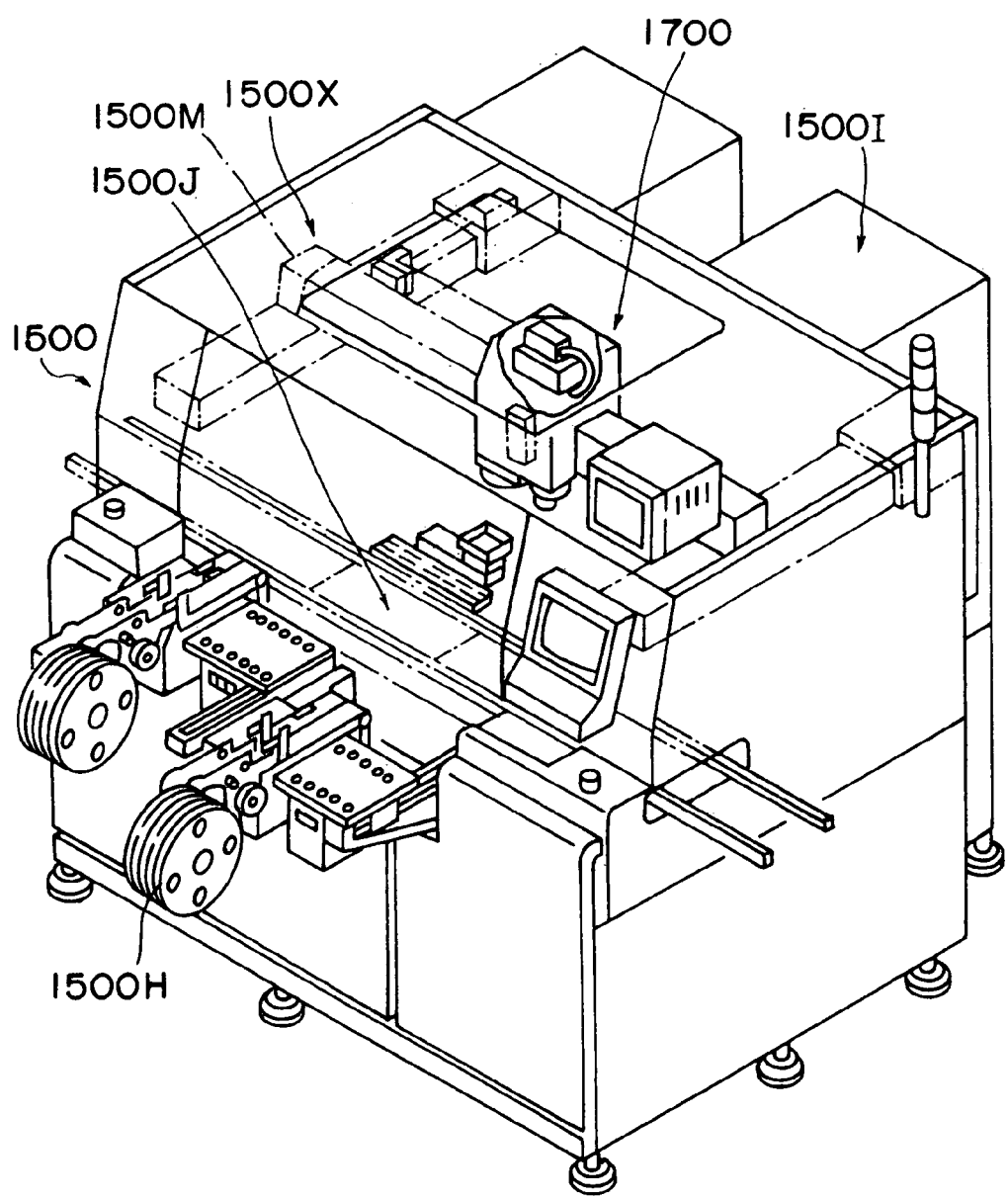
FIG. 24 is a general perspective view of component mounting equipment showing prior art.

As shown in FIG. 23, the head unit 303 is composed of ten nozzles 302, ten nozzle shafts 314, a vertical drive device 313, and a head unit board 315. The vertical drive device 313 has a vertical drive motor 316, a screw engagement section 317, an L-type plate 318 corresponding to the table 3 of former embodiments, ten coil springs 319, ten nozzle selection valves 321, cylinder sections 320 that correspond to the cylinders 4 to 13 of former embodiments and move vertically with ON/OFF operations of the nozzle selection valves 321, a nozzle turning timing belt 322, and gear sections 323. The numbers of the nozzles 302, the coil springs 319, and the nozzle selection valves 321 which are shown in FIG. 23 are ten, respectively; however, the numbers may be plural in general and therefore the members will be referred to as a plurality of nozzles 302, a plurality of coil springs 319, and a plurality of nozzle selection valves 321 in the following description. Reference numeral 89 in FIG. 26 denotes a nozzle suction device for controlling suction operations of the nozzles.

For vertical movement of a plurality of nozzles 302 in such a configuration, the vertical drive motor 316 fixed to the head unit board 315 is used as a drive source, rotational driving force of the vertical drive motor 316 is transmitted to the screw engagement section 317 provided in the L-type plate 318, and the L-type plate 318 is moved vertically, i.e., upward or downward by a predetermined amount with forward or reverse rotation in the screw engagement section 317. A plurality of nozzle selection valves 321 are fixed to the L-type plate 318, and the valves are configured so as to move cylinder units 320 selectively and vertically. Vertical movement by virtue of the nozzle selection valves 321 cannot be performed with an adjustment of an amount of the vertical movement, as distinct from vertical movement with the vertical drive motor 316 that is used as the drive source. That is because there are only two possible ways of the vertical movement, i.e., downward drive of a cylinder section 320 or a return to an original position of the cylinder section 320 with ON/OFF operation of a nozzle selection valve 321. A cylinder unit 320, driven downward selectively by a nozzle selection valve 321 in this way, pushes an upper end portion of a nozzle shaft 314 to move down a nozzle 302 connected to the nozzle shaft 314 and positions a tip of the nozzle 302 at a component holding height H1 shown in FIG. 23. In FIG. 23, one nozzle 302 out of a plurality of nozzles 302 has been pushed down selectively. In a state in which the nozzle 302 has been pushed down in this way, driving force of the vertical drive motor 316 is exerted upon the nozzle 302 through a medium of the nozzle selection valve 321 fixed to the L-type plate 318 and of the cylinder unit 320, and therefore an amount of vertical movement of the nozzle 302 can be varied by virtue of the vertical drive motor 316.

When the nozzle selection valve 321 is in OFF state, the nozzle 302 is being pushed upward by a biasing force of a coil spring 319, because one end of the coil spring 319 is engaged with the nozzle shaft 314 serving as an axis of the coil spring 319. The tip of the nozzle 302 is therefore situated at a basic height H0 shown in FIG. 23. The gear sections 323 of the nozzle shafts 314 mesh with the nozzle turning timing belt 322, and the head unit 315 corresponding to frame 1 is provided with such a θ-direction driving motor 215 as shown in FIG. 1 for the first embodiment. Forward and reverse rotation of a gear 215a on a rotating shaft of the θ-direction driving motor 215 causes movement of the nozzle turning timing belt 322, meshing with the gear 215a, and forward and reverse rotation or unidirectional rotation of the gear sections 323 of the nozzle shafts 314, so that a turning angle of the nozzle shafts 314 can be adjusted.

Operations of the component recognizing method according to the third embodiment in the above-mentioned configuration will be described with reference to FIG. 27.

Three electronic components 301 and one electronic component 310 are sucked and held by the head unit 303 equipped with four nozzles 302 (see step 21 of FIG. 27), and the head unit 303 is moved to a start position in a recognition area equipped with the line sensor 305. On the basis of control by virtue of the main control unit 307, the drive control unit 304 moves the head unit 303 at a constant velocity in the direction X1 over the line sensor 305 with heights of the nozzles 302 set at the first focus coincident height fit for the electronic components 301, and a holding status of the electronic components 301 and the electronic component 310 is imaged. To be more specific, for example, the main control unit 307 acquires information of a group of nozzles with components that can be recognized at the first focus coincident height from among the components sucked and held by the nozzles, and also acquires information of a group of nozzles with components that can be recognized at the second focus coincident height different from the first (see step 22 of FIG. 27), and heights of all the nozzles 302 are set at the first focus coincident height on condition that the components that can be recognized at the first focus coincident height are initially recognized (see step 23 of FIG. 27). With the heights of all the nozzles 302 set at the first focus coincident height in this manner, the head unit 303 is moved at a constant velocity in the direction X1 over the line sensor 305 and the holding status of the electronic components 301 and the electronic component 310 is imaged (see step 24 of FIG. 27).

When these imaging operations are completed, the image processing unit 306 performs recognition processing on the basis of image data of the electronic components 301 and the electronic component 310 which have been imaged. At this time, the heights of the nozzles 302 have been set at the first focus coincident height fit for three electronic components 301, so that image data of recognition image imaged clearly is obtained from three electronic components 301; however, the height of the nozzle 302 holding the electronic component 310 of which the thickness is different from the thickness of the electronic components 301 has not been set at the second focus coincident height but has been set at the first focus coincident height, so that image data of recognition image imaged unclearly is obtained from the electronic component 310.

The drive control unit 304 subsequently switches the traveling direction to the direction X2 so as to reciprocate the head unit 303, and moves the head unit 303 at a constant velocity in the direction X2 over the line sensor 305 with heights of the nozzles 302 changed to and set at the second focus coincident height fit for the electronic component 310, and a holding status of the electronic components 301 and the electronic component 310 is imaged. To be more specific, for example, the main control unit 307 sets the heights of all the nozzles 302 at the second focus coincident height on the basis of group information acquired before, on condition that the components that can be recognized at the second focus coincident height are subsequently recognized (see step 25 of FIG. 27). With the heights of all the nozzles 302 set at the second focus coincident height in this manner, the head unit 303 is moved at a constant velocity in the direction X2 over the line sensor 305 and the holding status of the electronic components 301 and the electronic component 310 is imaged (see step 26 of FIG. 27).

When these imaging operations are completed, the image processing unit 306 performs recognition processing on the basis of image data of the electronic components 301 and the electronic component 310 which have been imaged. At this time, the heights of the nozzles 302 have been set at the second focus coincident height fit for the electronic component 310, so that image data of recognition image imaged clearly is obtained from the electronic component 310; however, the heights of the nozzles 302 holding three electronic components 301 of which the thickness is different from that of the electronic component 310 have not been set at the first focus coincident height but have been set at the second focus coincident height, so that image data of recognition image imaged unclearly is obtained from the three electronic components 301.

When recognition of the holding status of the electronic components 301 and the electronic component 310 is completed, the main control unit 307 calculates correction quantities with respect to installation positions in a circuit board on the basis of a recognition processing result obtained from the image processing unit 306. At this time, the main control unit 307 selects for the three electronic components 301 a recognition processing result in which the nozzles 302 were imaged at the first focus coincident height fit for the electronic components 301, and selects for the one electronic component 310 a recognition processing result in which the nozzle 302 was imaged at the second focus coincident height fit for the electronic component 310. To be more specific, for example, the main control unit 307 selects image data of the electronic components 301 fit for the first focus coincident height from image data of recognition image obtained from recognition at the first focus coincident height, and selects image data of the electronic component 310 fit for the second focus coincident height from image data of recognition image obtained from recognition at the second focus coincident height, on the basis of group information acquired before.

Figure 27:
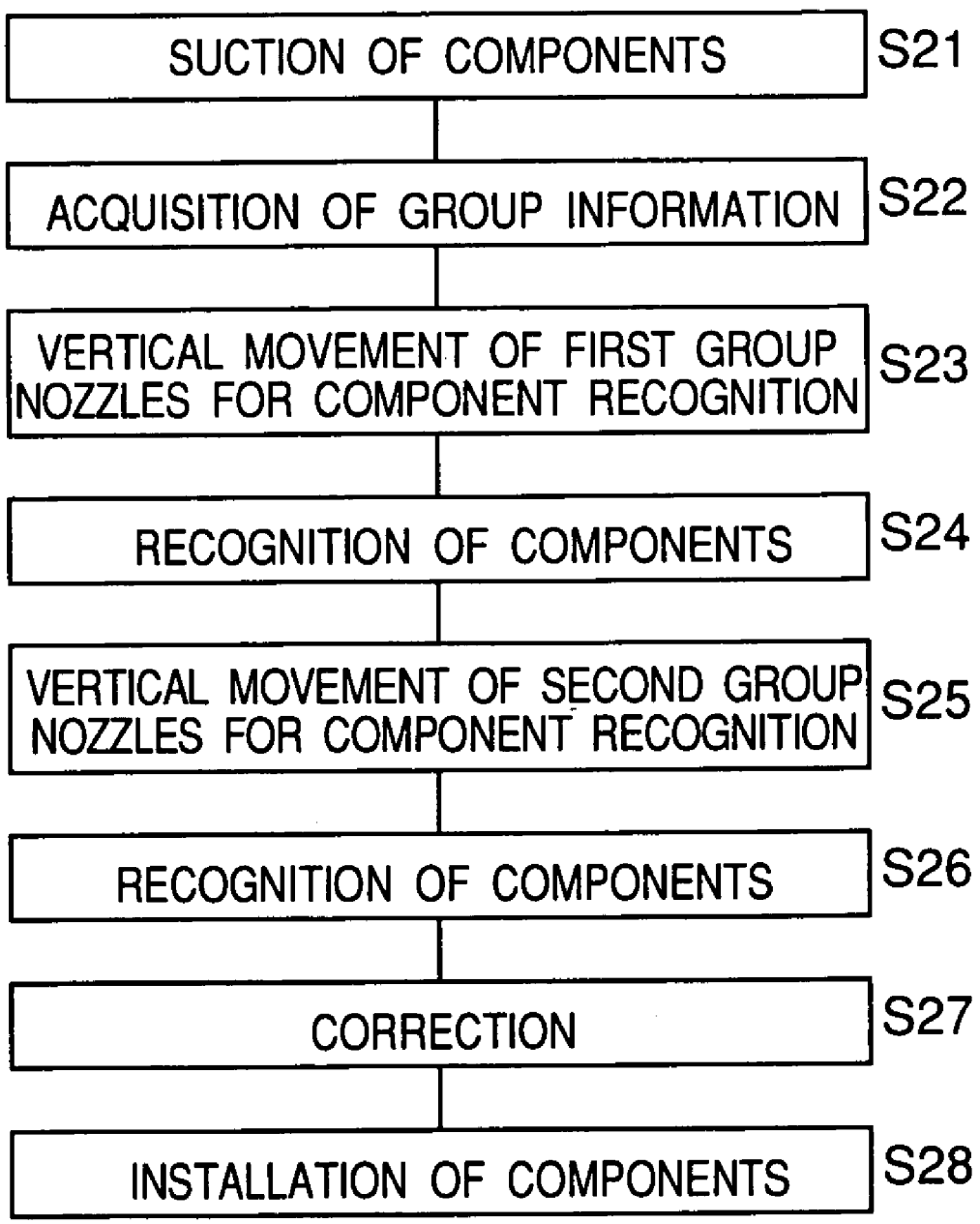
FIG. 27 is a flow chart of recognizing operations in the third embodiment.

On the basis of the recognition processing result fit for each electronic component, correction quantities for positional offsets of the electronic components 301 and the electronic component 310 with respect to suction positions of the nozzles 302 are taken into account (see step 27 of FIG. 27), and the electronic components are mounted at installation positions on the circuit board (see step 28 of FIG. 27).

For imaging with the line sensor 305 in the third embodiment, image data of both components fit for a focus coincident height and components not fit for the focus coincident height is temporarily captured and stored in a memory 90 for image processing, and thereafter, only the image data of the components fit for the focus coincident height is finally selected under control of the main control unit 307; however, the embodiment is not limited to this arrangement. For example, image data of only components fit for a focus coincident height may be captured during imaging with the line sensor 305, with previous reference to thickness data of electronic components held by the nozzles 302, from among data stored in the memory 91 for mounting in which such information is stored as component data including types, thicknesses, widths, lengths, weights, and the like of components for use in component mounting, mounting order for suction of components and the like, types of nozzles installed in the head unit, and relations between types of nozzles and types of components (in other words, information showing which component is to be sucked by which nozzle).

According to the third embodiment, as described above, during the component recognizing method in the electronic component mounting apparatus having the head unit equipped with the plurality of nozzles each for sucking the electronic component, the X-Y drive device for moving the head unit to a specified position in X-Y directions, the vertical drive device for driving vertically the nozzles provided for the head unit, the drive control unit for controlling the X-Y drive device and the vertical drive device, the line sensor for imaging electronic components sucked by the nozzles, the image processing unit for performing recognition processing while controlling the line sensor, and the main control unit for controlling the drive control unit and the image processing unit, the head unit is reciprocated in the X-direction over the line sensor, and the nozzles are vertically moved simultaneously so as to change heights of electronic components sucked by the nozzles to specified heights and the electronic components are imaged with the line sensor, each time the traveling direction of the head unit is switched over.

In accordance with the third embodiment, electronic components having different thicknesses are respectively sucked and held by the plurality of nozzles provided for the head unit. When a holding status of those components is imaged in a series of component recognition processes, the nozzles are simultaneously moved vertically, for example, so as to have a height (a focus coincident height) fit for imaging of a group of electronic components of which thicknesses are within an identical range, from among all the sucked electronic components. The head unit is moved in a forward direction of the X-direction over the line sensor while scanning and imaging are executed. For a purpose of imaging accurately the remaining group of electronic components for which the height of the nozzles during the preceding imaging is unsuitable, the traveling direction of the head unit is subsequently switched to a reverse direction and the nozzles are simultaneously moved vertically so as to have a height (a focus coincident height) fit for imaging of the remaining group of electronic components. The head unit is then moved in the reverse direction over the line sensor while scanning and imaging are executed anew. As a result, after completion of imaging of all the electronic components, recognition results of the imaging at respective focus coincident heights fit for the electronic components with different thicknesses are selected, and thus a holding status of a plurality of electronic components with different thicknesses can be imaged accurately during a series of component recognition processes.

Fourth Embodiment

Hereinbelow, a fourth embodiment of the present invention will be described in detail with reference to FIG. 21.

A configuration that is required for component recognition processes in an electronic component mounting apparatus of the fourth embodiment is basically the same as that in the third embodiment as described with reference to FIG. 20 and FIG. 23. Differences of the configuration of the fourth embodiment from that of the third embodiment will be described with reference to FIG. 21.

Figure 21:
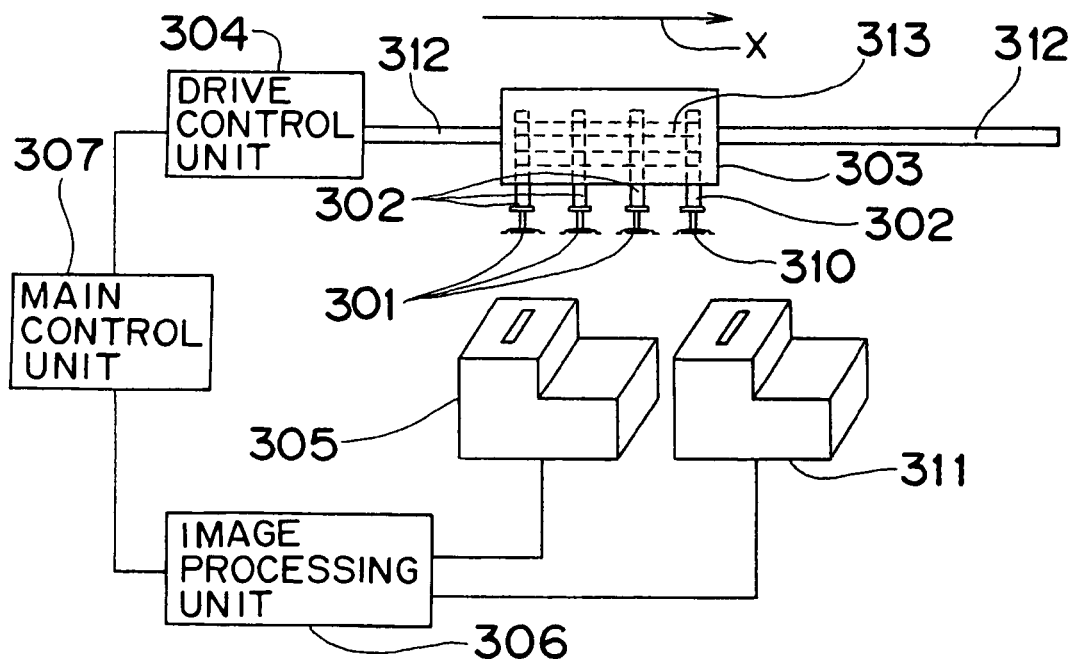
FIG. 21 is a diagram illustrating a basic configuration that is required for component recognition processes in an electronic component mounting apparatus of a fourth embodiment of the present invention.

As shown in FIG. 21, reference numeral 305 denotes a first line sensor for imaging a holding status of electronic components 301 and an electronic component 310, and numeral 311 denotes a second line sensor. These are configured so that a head unit 303 moves in one direction in a straight line over the first line sensor 305 and the second line sensor 311, and moves in a direction orthogonal to respective longitudinal directions of the first line sensor 305 and the second line sensor 311 both of which are rectangularly shaped. This configuration is provided so that the electronic components 301 and the electronic component 310 do not interfere with an imaging area of the second line sensor 311 during imaging of the electronic components 301 and the electronic component 310 over the first line sensor 305. This configuration is also provided so that the electronic components 301 and the electronic component 310 do not interfere with an imaging area of the first line sensor 305 during similar imaging of the electronic components 301 and the electronic component 310 by virtue of the second line sensor 311. The first line sensor 305 and the second line sensor 311 are connected to an image processing unit 306 so that information can be transmitted individually and mutually between the line sensors and the image processing unit.

For component recognition processes, the head unit 303 is moved at a constant velocity in one direction, i.e., in X-direction during the component recognition processes in the fourth embodiment, while the head unit is reciprocated in both directions X1 and X2 in the third embodiment.

Hereinbelow, operations of a component recognizing method of the fourth embodiment will be described.

Three electronic components 301 and one electronic component 310 are sucked and held by the head unit 303 equipped with four nozzles 302, and the head unit 303 is moved to a start position in a recognition area equipped with the first line sensor 305 and the second line sensor 311.

On the basis of control by virtue of a main control unit 307, subsequently, a drive control unit 304 moves the head unit 303 at a constant velocity in the X-direction over the first line sensor 305 with heights of the nozzles 302 set at a first focus coincident height fit for the electronic components 301, and the first line sensor 305 images a holding status of the electronic components 301 and the electronic component 310.

When these imaging operations are completed, the image processing unit 306 performs recognition processing on the basis of image data of the electronic components 301 and the electronic component 310 which have been imaged.

The drive control unit 304 subsequently moves the head unit 303 at a constant velocity still in the X-direction over the second line sensor 311 with heights of the nozzles 302 changed to and set at the second focus coincident height fit for the electronic component 310, and the second line sensor 311 images a holding status of the electronic components 301 and the electronic component 310.

The image processing unit 306 performs recognition processing on the basis of image data of the electronic components 301 and the electronic component 310 which have been imaged.

When recognition of the holding status of the electronic components 301 and the electronic component 310 is completed, the main control unit 307 calculates correction quantities with respect to installation positions on a circuit board on the basis of a recognition processing result obtained from the image processing unit 306. At this time, the main control unit 307 selects for the three electronic components 301 the recognition processing result in which the head unit 303 was imaged by the first line sensor 305, and selects for the one electronic component 310 the recognition processing result in which the head unit 303 was imaged by the second line sensor 311. On the basis of these recognition processing results fit for each electronic component, correction quantities for positional offsets of the electronic components 301 and the electronic component 310 with respect to suction positions of the nozzles 302 are taken into account, and the electronic components are installed at installation positions on the circuit board.

In accordance with the fourth embodiment, for the component recognizing method in the electronic component mounting apparatus having the head unit equipped with the plurality of nozzles each for sucking the electronic component, the X-Y drive device for moving the head unit to a specified position in the X-Y directions, the vertical drive device for driving vertically the nozzles provided for the head unit, the drive control unit for controlling the X-Y drive device and the vertical drive device, the line sensors for imaging electronic components sucked by the nozzles, the image processing unit for performing recognition processing while controlling the line sensors, and the main control unit for controlling the drive control unit and the image processing unit, the plurality of line sensors are provided and arranged in the X-direction, and during movement of the head unit in one direction, i.e., in the X-direction over the plurality of line sensors, the nozzles are vertically moved simultaneously for each line sensor so that heights of the electronic components sucked by the nozzles are changed to specified heights over each line sensor, and the electronic components are imaged by each line sensor.

In accordance with the fourth embodiment, a plurality of line sensors are provided and arranged in the recognition area and, during movement of the head unit in one direction, i.e., in the X-direction over the plurality of line sensors, component holding heights of the nozzles can be changed to a focus coincident height fit for each group of electronic components having thicknesses different from those of other groups, over each line sensor by vertical movement of the nozzles, so that effects similar to those of the above-mentioned invention can be achieved.

The present invention can be configured with various aspects in addition to those shown in the above-mentioned embodiments.

For example, the third and the fourth embodiments have been described with reference to the examples configured with line sensors; however, the embodiments can be implemented in the same way, for example, even if three-dimensional sensors are substituted for the line sensors.

The third embodiment has been described with reference to an example in which two types of electronic components 301 and 310 having different thicknesses are made to pass and return two times over the line sensor 305 for the imaging of the components; however, the embodiment can be implemented in the same way, even if the number of times the head unit passes and returns, and the number of times the component holding heights of the nozzles 302 can be changed, are increased according to the number of types of electronic components with different thicknesses, for example, even if the head unit 303 is made to pass and return three or four times provided a plurality of electronic components having different thicknesses suck and held by the head unit are of three or four types. The fourth embodiment also can be implemented in the same way, even if the number of the line sensors and the number of times the component holding heights of the nozzles 302 can be changed are increased according to the number of types of electronic components with different thicknesses suck and held by the head unit.

The third and the fourth embodiments have been described with reference to the examples configured with four nozzles 302; however, the number of the nozzles is not limited to four but has only to be plural.

When only five nozzles out of ten nozzles 302 are used, for example, the main control unit 307 may be made to control so that only image data of components held by the five nozzles in use is captured on the basis of information on use of these five nozzles.

Figure 28:
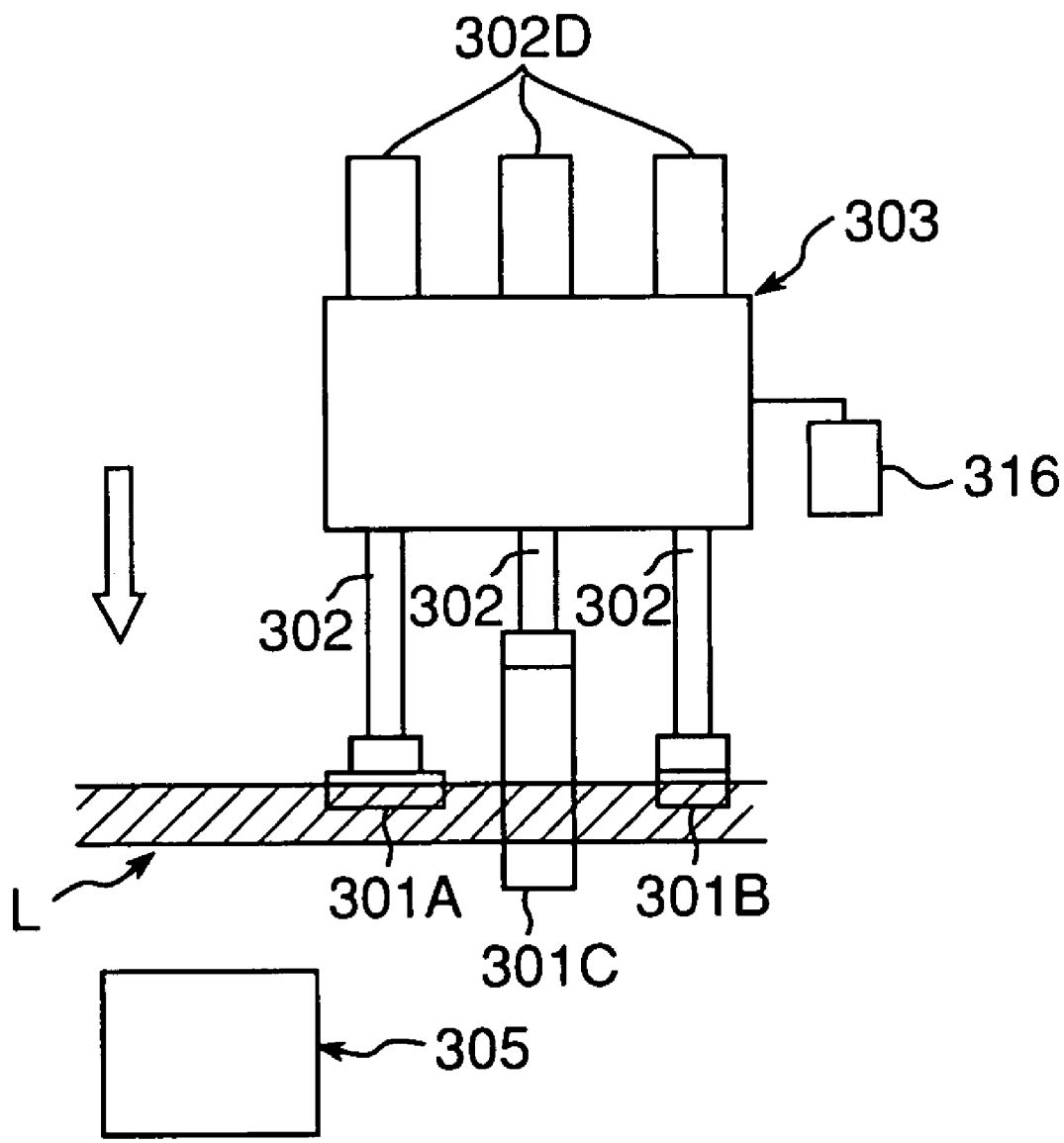
FIG. 28 is an explanatory drawing for explaining a positioning operation mode according to another embodiment of the present invention.

In the event that a positioning operation mode according to another embodiment of the present invention as shown in FIG. 28, in which each suction nozzle 302 of a head unit 303 has a nozzle vertical drive motor 302D, is not capable of bringing a component 301C into a recognizable range (L), for example, beyond a driving range of a respective nozzle vertical drive motor 302D in contrast to components 301A and 301B sucked and held by the suction nozzles 302 and brought into the recognizable range (L) by the drive of the nozzle vertical drive motors 302D, the components 301A and 301B may be recognized while being moved in one direction with respect to a line sensor 305, and a vertical drive motor 316 may be driven for lowering an L-type plate 318 and all the nozzles 302, thereby changing heights at which bottom surfaces of the components are located and bringing the component 301C into the recognizable range (L), and thereafter, the component 301C may be recognized while being moved in another direction opposite to the above-mentioned one direction with respect to the line sensor 305.

As described above, according to the present invention, components of which surfaces to be recognized are located at different heights can be continuously recognized by moving component holding members vertically according to the heights at which the surfaces to be recognized of the components are located during recognition of the components by virtue of a recognition unit. This arrangement eliminates a necessity of a plurality of repetitions of a component recognizing operation according to a variation in heights at which the surfaces to be recognized are located, allows components to be held at the same time and allows component recognizing operations to be performed continuously regardless of the heights of the surfaces to be recognized, so that an improvement in component mounting tact time can be achieved.

Besides, adjustment of heights at which the surfaces to be recognized are located can be achieved by a single drive unit though, conventionally, this adjustment has required drive units of which the number corresponds to the number of nozzles, and thus cost and weight of the apparatus can be reduced.

In addition, a positioning operation can be started accurately and in an inexpensive manner with arbitrary timing, provided that a velocity curve for vertical movement of a selected component holding member is produced with parameters of a target position in a direction of height at a time when the vertical movement of the selected component holding member is controlled by virtue of a drive unit so as to position a surface to be recognized of a component within a recognizable range of a recognition unit, a maximum velocity during vertical movement of the selected component holding member up to the target position, and a maximum acceleration during vertical movement of the selected component holding member up to the target position, and the positioning operation of the selected component holding member driven by the drive unit on the basis of the velocity curve is automatically started in response to a positioning operation starting instruction upon arrival at a positioning operation starting position of the selected component holding member moving transversely toward the recognition unit.

In accordance with the fourteenth aspect of the present invention, recognition of a plurality of components of which surfaces to be recognized are located at two different heights can be achieved by moving component holding members vertically and controlling heights at which surfaces to be recognized of the components are located to within a recognizable range of a recognition unit, as occasion requires, by virtue of a single drive unit for moving the component holding members vertically.

In accordance with the fifteenth aspect of the present invention, a component recognizing method for recognizing components having not less than three different heights can be achieved by moving component holding members vertically and controlling heights at which are located surfaces to be recognized of the components to within a recognizable range of a recognition unit, as occasion requires, by virtue of a single drive unit for moving the component holding members vertically, on condition that a plurality of sets of parameters of target positions and positioning operation starting positions are provided so as to allow continuous positioning operations to be executed with provision of a plurality of timings.

In accordance with the sixteenth aspect of the present invention, there is provided a component recognizing method in which whether individual positioning operations during continuous positioning operations, which were started at a plurality of positioning operation starting positions, have reached positioning operation ending positions or not is judged, i.e., a component recognizing method in which a possibility of recognition is judged by detecting whether a height at which is located an objective surface of each component has been brought into a recognizable range or not.

In accordance with the seventeenth aspect of the present invention, there is provided a component recognizing apparatus in which a component recognizing method according to the fourteenth aspect is configured accurately and in an inexpensive manner.

In accordance with the eighteenth aspect of the present invention, there is provided a component recognizing apparatus in which the component recognizing method of the fifteenth aspect is configured accurately and in an inexpensive manner.

In accordance with the nineteenth aspect of the present invention, there is provided a component recognizing apparatus in which the component recognizing method of the sixteenth aspect is configured accurately and in an inexpensive manner.

In accordance with the twenty-fourth to thirty-first aspects of the present invention, a plurality of electronic components having different thicknesses sucked and held by a head unit can be imaged at one time and accurately during a series of component recognition processes. As a result, productivity of component mounting can be increased with a reduction in extra time for movement of the head unit and minimization of occurrence of empty nozzles.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component recognizing method comprising:
   while transversely moving a plurality of component holding members relative to a recognition unit, with said plurality of component holding members holding a plurality of components such that surfaces of said plurality of components are at different levels, for the surface of a selected one of said plurality of components that does not correspond to a recognizable range of said recognition unit,
   (i) producing a velocity curve, for vertical movement of a corresponding one of said plurality of component holding members that is holding said selected one of said plurality of components, with parameters of
      (a) a target position in a height direction at a time when vertical movement of said corresponding one of said plurality of component holding members is to be controlled so as to position said surface of said selected one of said plurality of components within said recognizable range,
      (b) a maximum velocity of said corresponding one of said plurality of component holding members during vertical movement thereof to said target position, and
      (c) a maximum acceleration of said corresponding one of said plurality of component holding members during vertical movement thereof to said target position; and
   (ii) on a basis of said velocity curve, and in response to a starting instruction upon arrival of said corresponding one of said plurality of component holding members at a starting position due to said corresponding one of said plurality of component holding members moving transversely toward said recognition unit, automatically starting vertical movement of said corresponding one of said plurality of component holding members so as to adjust the level of said surface of said selected one of said plurality of components such that this surface is brought within said recognizable range, and
   (iii) when said surface of said selected one of said plurality of components comes within said recognizable range, using said recognition unit to recognize this surface.

2. The component recognizing method according to claim 1, wherein when bottom end surfaces of said plurality of component holding members are at identical levels said surfaces of said plurality of components are incapable of all being within said recognizable range simultaneously, said method further comprising:
   acquiring information on groups of said plurality of component holding members that hold respective ones of said plurality of components having surfaces which are capable of being received within said recognizable range simultaneously,
   wherein transversely moving said plurality of component holding members relative to said recognition unit comprises
      (i) moving said plurality of component holding members in a first direction over said recognition unit such that a corresponding surface of each of said plurality of components held by said component holding members of one of said groups is within said recognizable range without first vertically moving a corresponding one of said plurality of component holding members, and
      (ii) moving said plurality of component holding members in a second direction, opposite to said first direction, over said recognition unit such that a corresponding surface of each of said plurality of components held by said component holding members of a second of said groups is within said recognizable range after first vertically moving of a corresponding one of said plurality of component holding members.

3. The component recognizing method according to claim 1, further comprising:
   producing a velocity curve, for vertical movement of each other of said plurality of component holding members, with parameters of
      (i) a target position in a height direction at a time when vertical movement of said each other of said plurality of component holding members is to be controlled so as to position the surface of the component held by said each other of said plurality of component holding members within said recognizable range, (ii) a maximum velocity of said each other of said plurality of component holding members during vertical movement thereof to said target position, and
(iii) a maximum acceleration of said each other of said plurality of component holding members during vertical movement thereof to said target position;
on a basis of said velocity curve for each other of said plurality of component holding members, and in response to a starting instruction upon arrival of said each other of said plurality of component holding members at a starting position due to said each other of said plurality of component holding members moving transversely toward said recognition unit, automatically starting vertical movement of said each other of said plurality of component holding members, at different times, so as to position said surface of said component held by said each other of said plurality of component holding members within said recognizable range; and
when said surface of said component held by said each other of said plurality of component holding members comes within said recognizable range, using said recognition unit to recognize this surface, thereby continuously recognizing said surfaces of said plurality of components.

4. The component recognizing method according to claim 3, further comprising:
judging whether ending positions, corresponding to the starting positions for said corresponding one and said each other of said plurality of component holding members, have been reached so as to determine whether said surfaces of said components held by said corresponding one and said each other of said plurality of component holding members have been received within said recognizable range.

5. A component recognizing apparatus comprising:
a recognition unit;
a plurality of transversely movable component holding members;
a drive unit for vertically moving said plurality of component holding members;
a first control unit for producing a velocity curve, for vertical movement of a selected one of said plurality of component holding members, with parameters of
(i) a target position in a height direction at a time when vertical movement of said selected one of said plurality of component holding members is to be controlled so as to position the surface of the component held by said selected one of said plurality of component holding members within the recognizable range,
(ii) a maximum velocity of said selected one of said plurality of component holding members during vertical movement thereof to the target position, and
(iii) a maximum acceleration of said selected one of said plurality of component holding members during vertical movement thereof to the target position; and
a second control unit for, on a basis of the velocity curve, and in response to a starting instruction upon arrival of said selected one of said plurality of component holding members at a starting position due to the selected one of said plurality of component holding members moving transversely toward said recognition unit, automatically starting vertical movement of said selected one of said plurality of component holding members so as to position the surface of the component held by said selected one of said plurality of component holding members within the recognizable range,
wherein said recognition unit, said plurality of component holding members, said drive unit, said first control unit and said second control unit are constructed and arranged such that while said plurality of component holding members are transversely moved relative to said recognition unit, with said plurality of component holding members holding a plurality of components such that surfaces of the plurality of components are at different levels,
(i) for the surface of the component held by said selected one of said plurality of component holding members, said selected one of said plurality of component holding members is vertically moved by said drive unit so as to adjust the level of this surface such that this surface is brought within the recognizable range, and
(ii) when the surface of the component held by said selected one of said plurality of component holding members comes within the recognizable range, said recognition unit is used to recognize this surface.

6. The component recognizing apparatus according to claim 5, wherein when bottom end surfaces of said plurality of component holding members are at identical levels the surfaces of the plurality of components are incapable of all being within the recognizable range simultaneously, said apparatus further comprising:
structure for acquiring information on groups of said plurality of component holding members that hold respective ones of the plurality of components having surfaces which are capable of being received within the recognizable range simultaneously,
wherein said recognition unit, said plurality of component holding members and said drive unit are constructed and arranged such that transversely moving said plurality of component holding members relative to said recognition unit comprises
(i) moving said plurality of component holding members in a first direction over said recognition unit such that a corresponding surface of each of the plurality of components held by said holding members of one of said groups is within the recognizable range without first vertically moving a corresponding one of said plurality of component holding members, and
(ii) moving said plurality of component holding members in a second direction, opposite to said first direction, over said recognition unit such that a corresponding surface of each of the plurality of components held by said holding members of a second of said groups is within the recognizable range after first using said drive unit to vertically move a corresponding one of said plurality of component holding members.

7. The component recognizing apparatus according to claim 5, wherein
said first control unit is also for producing a velocity curve, for vertical movement of each other of said plurality of component holding members, with parameters of
(i) a target position in a height direction at a time when vertical movement of said each other of said plurality of component holding members is to be controlled so as to position the surface of the component held by said each other of said plurality of component holding members within the recognizable range, (ii) a maximum velocity of said each other of said plurality of component holding members during vertical movement thereof to the target position, and (iii) a maximum acceleration of said each other of said plurality of component holding members during vertical movement thereof to the target position; and said second control unit is also for, on a basis of the velocity curve for each other of said plurality of component holding members, and in response to a starting instruction upon arrival of said each other of said plurality of component holding members at a starting position due to said each other of said plurality of component holding members moving transversely toward said recognition unit, automatically starting vertical movement of said each other of said plurality of component holding members, at different times, so as to position the surface of the component held by said each other of said plurality of component holding members within the recognizable range such that while said plurality of component holding members are transversely moved relative to said recognition unit, with said plurality of component holding members holding the plurality of components such that surfaces of the components are at different levels, (i) for the surface of the component held by said each other of said plurality of component holding members, said each other of said plurality of component holding members is vertically moved by said drive unit so as to adjust the level of this surface such that this surface is brought within the recognizable range, and (ii) when the surface of the component held by said each other of said plurality of component holding members comes within the recognizable range, said recognition unit is used to recognize this surface, so as to continuously recognize the surfaces of the plurality of components.

8. The component recognizing apparatus according to claim 7, wherein said second control unit is also for judging whether ending positions, corresponding to the starting positions for said selected one and said each other of said plurality of component holding members, have been reached so as to determine whether the surfaces of the components held by said selected one and said each other of said plurality of component holding members have been received within the recognizable range.

9. A component mounting apparatus comprising:

a first group and a second group of component holding members;

a table having cylinders fixed thereto, said cylinders corresponding to said component holding members;

a drive unit to vertically move said table such that each of said cylinders is capable of bringing a tip of a piston into contact with a selected corresponding one of said component holding members so as to vertically move the selected corresponding one of said component holding members, from among the other of said component holding members;

a recognition unit;

a head unit including said component holding members and said drive unit; and structure for acquiring information on said first group and said second group of component holding members, wherein each component holding member of said first group is to hold a component such that a surface of this component is within a recognizable range of said recognition unit when a bottom end surface of said each component holding member of said first group is at a first level, and wherein each component holding member of said second group is to hold a component such that a surface of this component is not within the recognizable range of said recognition unit when a bottom end surface of said each component holding member of said second group is at the first level, wherein said table, said first and second groups of component holding members, said drive unit, said recognition unit and said head unit are constructed and arranged such that (i) while moving said each component holding member of said first group in a first direction over said recognition unit such that said bottom end surface of said each component holding member of said first group is at the first level, the surface of each component held by said each component holding member of said first group is recognized by said recognition unit, and then (ii) after using said drive unit to vertically move said table so as to vertically move said each component holding member of said second group such that the surface of each component held by said each component holding member of said second group is within the recognizable range of said recognition unit, and while moving said each component holding member of said second group in a second direction, opposite to the first direction, over said recognition unit, the surface of each component held by said each component holding member of said second group is recognized by said recognition unit.

10. The component mounting apparatus according to claim 9, wherein said recognition unit is constructed and arranged such that recognizing the surface of each component held by said each component holding member of said first group, by said recognition unit, includes recognizing a shape of each component held by said each component holding member of said first group, and recognizing the surface of each component held by said each component holding member of said second group, by said recognition unit, includes recognizing a shape of each component held by said each component holding member of said second group.

11. A component mounting apparatus comprising:

a plurality of transversely movable component holding members;

a table in screw engagement with a ball screw;

cylinders fixed to said table, said cylinders corresponding to said component holding members;

a recognition unit;

a drive unit including a motor that is adapted to rotate said ball screw so as to vertically move said table such that a tip of a piston is brought into contact with a selected corresponding one of said component holding members so as to vertically move the selected corresponding one of said component holding members, from among the other of said component holding members;

a head unit including said plurality of component holding members and said drive unit;

a first control unit for producing a velocity curve, for vertical movement of selected ones of said plurality of component holding members, with parameters of (i) a target position in a height direction at a time when vertical movement of said selected ones of said plurality of component holding members is to be controlled by said motor so as to position the surfaces of the components held by said selected ones of said plurality of component holding members within the recognizable range,
(ii) a maximum velocity of said selected ones of said plurality of component holding members during vertical movement thereof to the target position, and
(iii) a maximum acceleration of said selected ones of said plurality of component holding members during vertical movement thereof to the target position; and a second control unit for, on a basis of the velocity curve, and in response to a starting instruction upon arrival of said selected ones of said plurality of component holding members at a starting position due to said selected ones of said plurality of component holding members moving transversely toward said recognition unit, driving said motor so as to automatically start vertical movement of said selected ones of said plurality of component holding members so as to position the surfaces of the components held by said selected ones of said plurality of component holding members within said recognizable range, wherein said recognition unit, said plurality of component holding members, said table, said drive unit, said head unit, said first control unit and said second control unit are constructed and arranged such that while said plurality of component holding members are transversely moved relative to said recognition unit, with said plurality of component holding members holding a plurality of components such that surfaces of the plurality of components are at different levels,
  (i) for each surface of the plurality of components that does not correspond to a recognizable range of said recognition unit, a corresponding one of said plurality of component holding members is vertically moved by said drive unit so as to adjust the level of this surface such that this surface is brought within the recognizable range, and
  (ii) when each surface of the plurality of components comes within the recognizable range, said recognition unit is used to recognize this surface,
so as to continuously recognize the surfaces of the plurality of components.

12. The component mounting apparatus according to claim 11, wherein when bottom end surfaces of said plurality of component holding members are at identical levels the surfaces of the plurality of components are incapable of all being within the recognizable range simultaneously, said apparatus further comprising:

structure for acquiring information on groups of said plurality of component holding members that hold respective ones of the plurality of components having surfaces which are capable of being received within the recognizable range simultaneously, wherein said recognition unit, said plurality of component holding members, said drive unit and said head unit are constructed and arranged such that transversely moving said plurality of component holding members relative to said recognition unit comprises
  (i) moving said plurality of component holding members in a first direction over said recognition unit such that a corresponding surface of each of the plurality of components held by said component holding members of one of said groups is within the recognizable range without first vertically moving a corresponding one of said plurality of component holding members, and
  (ii) moving said plurality of component holding members in a second direction, opposite to said first direction, over said recognition unit such that a corresponding surface of each of the plurality of components held by said component holding members of a second of said groups is within the recognizable range after first using said drive unit to vertically move a corresponding one of said plurality of component holding members.

13. The component mounting apparatus according to claim 11, further comprising:
a transverse movement motor for moving said plurality of component holding members in a transverse direction,
wherein said first control unit is also for producing a velocity curve, for transverse movement of said selected ones of said plurality of component holding members via said transverse movement motor, with parameters of
  (i) a target position in the transverse direction at a time when transverse movement of said selected ones of said plurality of component holding members to vertical drive starting positions for said selected ones of said plurality of component holding members is to be controlled by said transverse movement motor so as to prepare to position the surfaces of the components held by said respective ones of said plurality of component holding members within the recognizable range,
  (ii) a maximum velocity of said selected ones of said plurality of component holding members during transverse movement thereof to the target position, and
  (iii) a maximum acceleration of said selected ones of said plurality of component holding members during transverse movement thereof to the target position; and
wherein said second control unit is also for, on a basis of the velocity curve for transverse movement and in response to a starting instruction, driving said transverse movement motor so as to move said selected ones of said plurality of component holding members to the starting position due to said selected ones of said plurality of component holding members moving with said head unit transversely toward said recognition unit.

14. A component mounting apparatus comprising:
a first group and a second group of component holding members;
a table having cylinders fixed thereto, said cylinders corresponding to said component holding members;
a drive unit to vertically move said table such that each of said cylinders is capable of bringing a tip of a piston into contact with a selected corresponding one of said component holding members so as to vertically move the selected corresponding one of said component holding members, from among the other of said component holding members;
a recognition unit;
a head unit including said component holding members and said drive unit; and
structure for acquiring information on said first group and said second group of component holding members, wherein each component holding member of said first group is to hold a component such that a surface of this component is within a recognizable range of said recognition unit when a bottom end surface of said each component holding member of said first group is at a first level, and wherein each component holding member of said second group is to hold a component such that a surface of this component is not within the recognizable range of said recognition unit when a bottom end surface of said each component holding member of said second group is at the first level, wherein said table, said first and second groups of component holding members, said drive unit, said recognition unit and said head unit are constructed and arranged such that (i) while moving said each component holding member of said first group in a first direction over said recognition unit such that said bottom end surface of said each component holding member of said first group is at the first level, the surface of each component held by said each component holding member of said first group is recognized by using said recognition unit to recognize a shape of this component, and then (ii) after using said drive unit to vertically move said table so as to vertically move said each component holding member of said second group such that the surface of each component held by said each component holding member of said second group is within the recognizable range of said recognition unit, and while moving said each component holding member of said second group in a second direction, opposite to the first direction, over said recognition unit, the surface of each component held by said each component holding member of said second group is recognized by using said recognition unit to recognize a shape of this component.

15. A component mounting method comprising:
providing
   (i) a plurality of transversely movable component holding members,
   (ii) a table in screw engagement with a ball screw,
   (iii) cylinders fixed to said table, said cylinders corresponding to said component holding members,
   (iv) a recognition unit, and
   (v) a drive unit including a motor that is adapted to rotate said ball screw so as to vertically move said table such that a tip of a piston is brought into contact with a selected corresponding one of said component holding members so as to vertically move the selected corresponding one of said component holding members, from among the other of said component holding members;

using a first control unit to produce a velocity curve, for vertical movement of selected ones of said plurality of component holding members, with parameters of
   (i) a target position in a height direction at a time when vertical movement of said selected ones of said plurality of component holding members is to be controlled by said motor so as to position the surfaces of the components held by said selected ones of said plurality of component holding members within the recognizable range,
   (ii) a maximum velocity of said selected ones of said plurality of component holding members during vertical movement thereof to the target position, and
   (iii) a maximum acceleration of said selected ones of said plurality of component holding members during vertical movement thereof to the target position;

while said plurality of component holding members are transversely moved relative to said recognition unit, with said plurality of component holding members holding a plurality of components such that surfaces of the plurality of components are at different levels, using a second control unit to, on a basis of the velocity curve, and in response to a starting instruction upon arrival of said selected ones of said plurality of component holding members at a starting position due to said selected ones of said plurality of component holding members moving transversely toward said recognition unit, for each surface of said plurality of components that does not correspond to a recognizable range of said recognition unit, using said drive unit to vertically move said table so as to vertically move a corresponding one of said plurality of component holding members such that the level of this surface is adjusted whereby this surface is brought within said recognizable range; and when each surface of said plurality of components comes within said recognizable range, using said recognition unit to recognize this surface, so as to continuously recognize said surfaces of said plurality of components.

* * * * *